(12) United States Patent
Leong

(10) Patent No.: US 9,154,151 B1
(45) Date of Patent: Oct. 6, 2015

(54) ANALOG-TO-DIGITAL CONVERTER CIRCUITS AND METHODS

(71) Applicant: Altera Corporation, San Jose, CA (US)

(72) Inventor: Mun Fook Leong, Bukit Mertajam (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/579,397

(22) Filed: Dec. 22, 2014

(51) Int. Cl.
*H03M 1/00* (2006.01)
*H03M 1/18* (2006.01)
*H03M 1/12* (2006.01)
*H03M 1/40* (2006.01)

(52) U.S. Cl.
CPC .............. *H03M 1/182* (2013.01); *H03M 1/002* (2013.01); *H03M 1/1245* (2013.01); *H03M 1/403* (2013.01)

(58) Field of Classification Search
CPC ..... H03M 1/00; H03M 1/12; H03M 2201/51; H03M 2201/11; H03M 2201/20
USPC .................................. 341/155, 156, 172, 164
See application file for complete search history.

(56) References Cited

U.S. PATENT DOCUMENTS

| | | | | |
|---|---|---|---|---|
| 4,393,368 A | * | 7/1983 | Rasmussen | .................... 341/156 |
| 5,714,955 A | * | 2/1998 | Reay et al. | .................... 341/155 |
| 7,432,844 B2 | | 10/2008 | Mueck et al. | |
| 8,059,022 B2 | | 11/2011 | Cho et al. | |
| 8,390,501 B2 | | 3/2013 | Chang et al. | |
| 8,446,304 B2 | | 5/2013 | Scanlan | |
| 8,674,862 B1 | | 3/2014 | Li et al. | |
| 8,717,221 B2 | | 5/2014 | Jeon et al. | |
| 2003/0071748 A1 | * | 4/2003 | Huang et al. | ................... 341/155 |

OTHER PUBLICATIONS

Yan Zhu, et al., "Linearity Analysis on a Series-Split Capacitor Array for High-Speed SAR ADCs," Midwest Symposium on Circuits and Systems—MWSCAS, pp. 922-925, 2008.
Pierangelo Confalonieri, et al., "A 2.7mW 1MSps 10b analog-to-digital converter with built-in reference buffer and 1LSB accuracy programmable input ranges," Proceeding of the 30th European Solid-State Circuits Conference, 2004, pp. 255-258.
"Tutorial 1080: Understanding SAR ADCs: Their Architecture and Comparison with Other ADCs," Oct. 2, 2001, Maxim Integrated Products, Inc., pp. 1-9.

* cited by examiner

*Primary Examiner* — Jean B Jeanglaude
(74) *Attorney, Agent, or Firm* — Steven J. Cahill

(57) ABSTRACT

An analog-to-digital converter circuit includes a digital-to-analog converter circuit, a voltage stabilization circuit, and a comparator circuit. The digital-to-analog converter circuit generates an analog signal based on digital signals and a reference voltage. The voltage stabilization circuit reduces variations in the reference voltage in response to at least one of the digital signals. The comparator circuit generates a comparison output based on the analog signal. The digital signals are generated based on the comparison output.

21 Claims, 14 Drawing Sheets

ANALOG-TO-DIGITAL CONVERTER CIRCUITS AND METHODS

FIELD OF THE DISCLOSURE

The present disclosure relates to electronic circuits, and more particularly, to circuits and methods for analog-to-digital conversion.

BACKGROUND

An analog-to-digital converter (ADC) circuit is used to convert a continuous analog signal into a discrete digital signal. One type of ADC is a successive approximation register (SAR) ADC. A SAR ADC typically has a comparator, a successive approximation register, and an internal digital-to-analog converter (DAC). In operation, a SAR ADC performs a binary search on each sample of the analog signal to determine an approximate digital output for each sample. A SAR ADC may include an array of individually switched capacitors in the internal DAC. The array, the comparator, and the successive approximation register are used to perform the binary search.

BRIEF SUMMARY

According to some embodiments, an analog-to-digital converter circuit includes a digital-to-analog converter circuit, a voltage stabilization circuit, and a comparator circuit. The digital-to-analog converter circuit generates an analog signal based on digital signals and a reference voltage. The voltage stabilization circuit reduces variations in the reference voltage in response to at least one of the digital signals. The comparator circuit generates a comparison output based on the analog signal. The digital signals are generated based on the comparison output.

Various objects, features, and advantages of the present invention will become apparent upon consideration of the following detailed description and the accompanying drawings.

DETAILED DESCRIPTION

A successive approximation register (SAR) analog-to-digital converter (ADC) circuit may include a comparator, a unity gain buffer, a digital-to-analog converter (DAC) circuit that has an array of capacitors, and successive approximation register logic. The unity gain buffer generates a buffered reference voltage. The buffered reference voltage is used to charge the array of capacitors for generating bits in a digital output. During the analog-to-digital conversion, the buffered reference voltage generated by the unity gain buffer may experience a significant undershoot or overshoot relative to an ideal reference voltage as the array of capacitors is charged. The unity gain buffer may not be fast enough to prevent an offset between the buffered reference voltage and the ideal reference voltage by the end of the bit charge redistribution cycle for one or more of the digital output bits. At a high sampling rate, the buffered reference voltage may not settle to the ideal reference voltage fast enough for the comparator to make the correct decision for one or more of the digital output bits. The accuracy of a SAR ADC may be significantly degraded at a high sampling rate and is dependent on the gain bandwidth of the unity gain buffer. Returning the unity gain buffer to cause the buffered reference voltage to settle to the ideal reference voltage by the end of the bit charge redistribution cycle at a high sampling rate typically causes significantly more power consumption.

According to some embodiments disclosed herein, an analog-to-digital converter (ADC) circuit includes a comparator, a voltage stabilization circuit, and a digital-to-analog converter (DAC) circuit that has a capacitor array. A reference voltage is used to charge the capacitor array for generating digital output bits. The voltage stabilization circuit reduces variations in the reference voltage to reduce any offset between the reference voltage and an ideal reference voltage by the end of the bit charge redistribution cycle for one or more of the digital output bits. The voltage stabilization circuit causes the reference voltage to be closer to the ideal reference voltage to allow the comparator to make correct decisions for the digital output bits.

Figure 1:
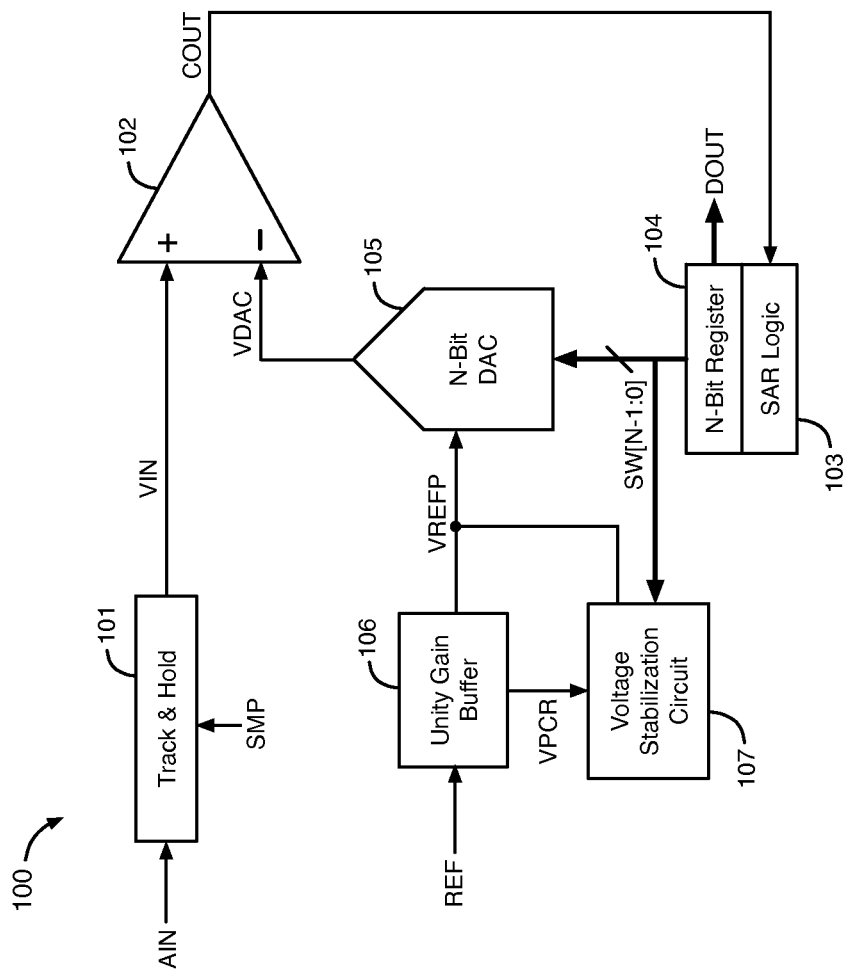
FIG. 1 illustrates an example of an analog-to-digital converter (ADC) circuit having a voltage stabilization circuit, according to an embodiment of the present invention.

FIG. 1 illustrates an example of an analog-to-digital converter (ADC) circuit 100 having a voltage stabilization circuit, according to an embodiment of the present invention. ADC circuit 100 is a successive approximation register (SAR) ADC. ADC circuit 100 includes track and hold circuit 101, voltage comparator circuit 102, successive approximation register (SAR) logic circuit 103, N-bit register circuit 104, N-bit digital-to-analog converter (DAC) circuit 105, unity gain buffer circuit 106, and voltage stabilization circuit 107. ADC 100 may, for example, be in an integrated circuit.

ADC circuit 100 converts a continuous analog input signal AIN into a set of digital signals DOUT that indicate digital bits. Analog input signal AIN and a sampling control signal SMP are provided to inputs of track and hold circuit 101. Sampling control signal SMP may be a periodic signal. Track and hold circuit 101 generates a voltage signal VIN at its output based on the analog input signal AIN. Track and hold circuit 101 samples and holds the voltage of analog input signal AIN to generate signal VIN at repeating time intervals that are determined by signal SMP. Track and hold circuit 101 may, for example, include a switch circuit and a storage capacitor. In the track mode, the switch circuit is closed, thereby coupling input signal AIN to the storage capacitor, and allowing the charge on the storage capacitor to track input signal AIN. In the hold mode, the switch circuit is open, isolating the storage capacitor from input signal AIN, and causing the storage capacitor to indicate the voltage of input signal AIN at the time the switch circuit was opened. Track and hold circuit 101 uses the charge stored on the storage capacitor to generate the voltage of signal VIN. Signal VIN is provided to the non-inverting (+) input of comparator circuit 102.

A reference voltage REF is provided to an input of unity gain buffer circuit 106. Reference voltage REF is a constant reference voltage. Reference voltage REF may, for example, be generated by a bandgap reference voltage generator circuit. Unity gain buffer circuit 106 buffers reference voltage REF to generate a buffered reference voltage VREFP. Reference voltage VREFP is provided to an input of N-bit DAC circuit 105.

Unity gain buffer circuit 106 also buffers reference voltage REF to generate a pre-charge reference voltage VPCR. The pre-charge reference voltage VPCR is provided to an input of voltage stabilization circuit 107. An N number of digital signals SW[N−1:0] are provided to additional inputs of voltage stabilization circuit 107. N may be any positive integer number. Voltage stabilization circuit 107 reduces variations in reference voltage VREFP based on the pre-charge reference voltage VPCR in response to the digital signals SW[N−1:0], as described in further detail below.

Digital signals SW[N−1:0] are also provided to inputs of N-bit DAC circuit 105. N-bit DAC circuit 105 generates an analog voltage signal VDAC based on digital signals SW[N−1:0] using the reference voltage VREFP. N-bit DAC circuit 105 converts the digital signals SW[N−1:0] into the analog voltage signal VDAC using the reference voltage VREFP. The analog voltage signal VDAC is provided to the inverting (−) input of comparator circuit 102.

Comparator circuit 102 compares the voltage of signal VDAC to the voltage of signal VIN to generate an output signal COUT at its output. Output signal COUT is provided to an input of SAR logic circuit 103. SAR logic circuit 103 generates a digital output based on the output signal COUT of comparator circuit 102. The digital output of SAR logic circuit 103 is stored in the N-bit register circuit 104 as the N number of digital signals SW[N−1:0]. Circuits 103-104 are collectively referred to herein as a successive approximation register circuit.

ADC circuit 100 performs a binary search algorithm on each sample of the analog input signal AIN to generate a digital output that is indicated by an N number of digital output signals DOUT. Further details of the binary search algorithm performed by ADC circuit 100 are described below. After the analog-to-digital conversion is complete for each sample of the analog input signal AIN, N-bit register circuit 104 provides the final digital output of SAR logic circuit 103 as output signals DOUT. Output signals DOUT represent the digital value of a corresponding sample of the analog input signal AIN.

Figure 2:
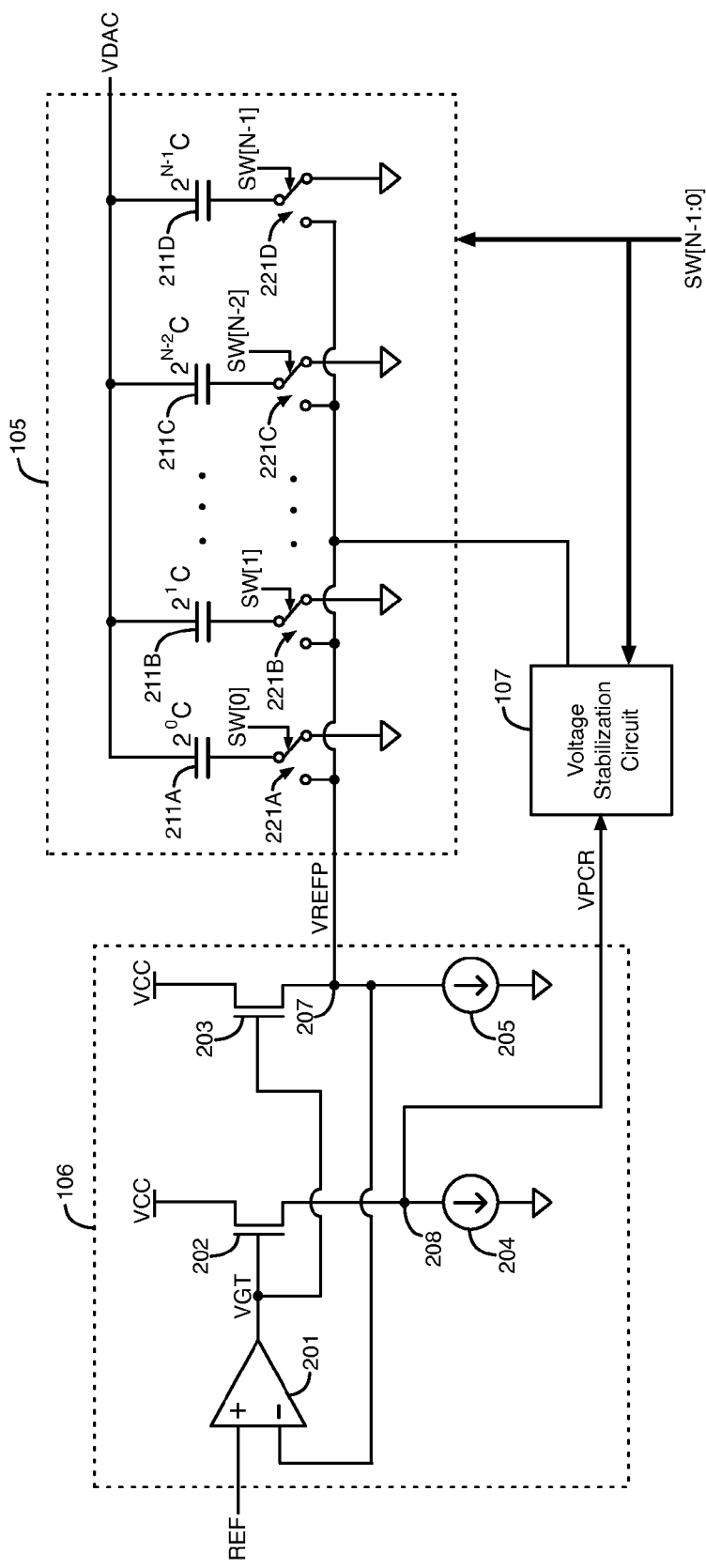
FIG. 2 illustrates further details of the unity gain buffer circuit and the N-bit digital-to-analog converter circuit shown in FIG. 1, according to an embodiment of the present invention.

FIG. 2 illustrates further details of unity gain buffer circuit 106 and N-bit DAC circuit 105, according to an embodiment of the present invention. In the embodiment of FIG. 2, unity gain buffer circuit 106 includes an amplifier circuit 201, n-channel field-effect transistors 202-203, and constant current source circuits 204 and 205. In the embodiment of FIG. 2, N-bit DAC circuit 105 includes an N number of capacitors 211, including capacitors 211A-211D, and an N number of switch circuits 221, including switch circuits 221A-221D. N is any suitable positive integer. N refers to the same number in FIGS. 1-6. N equals the total number of ADC conversion bits generated in output signals DOUT for each sample of input signal AIN. FIG. 2 also shows voltage stabilization circuit 107.

Reference voltage REF is provided to the non-inverting (+) input of amplifier circuit 201. Reference voltage VREFP is provided to the inverting (−) input of amplifier circuit 201. The output of amplifier circuit 201 is coupled to the gates of n-channel transistors 202-203. Amplifier circuit 201 amplifies the voltage difference between voltages REF and VREFP at its inputs to generate an output voltage signal VGT at the gates of transistors 202 and 203.

The drains of transistors 202 and 203 are coupled to a node at a supply voltage VCC. The source of transistor 202 is coupled to current source circuit 204. The source of transistor 203 is coupled to current source circuit 205. Current source circuits 204 and 205 are coupled to a node at the ground voltage. The source of transistor 203 and current source circuit 205 are coupled to the inverting input of amplifier circuit 201 at node 207 at voltage VREFP. The source of transistor 202 and current source circuit 204 are coupled to voltage stabilization circuit 107 at node 208 at voltage VPCR.

Amplifier circuit 201 drives its output signal VGT to a voltage that causes the reference voltage VREFP to be equal to or approximately equal to reference voltage REF. Amplifier circuit 201 may generate a very small voltage difference (for example, less than 1 millivolt) between the voltages REF and VREFP at its inputs. The voltage gain of unity gain buffer circuit 106 (i.e., VREFP/REF) ideally equals one. Reference voltage REF represents an ideal voltage for the reference voltage VREFP. However, the switching of switch circuits in DAC circuit 105 may cause reference voltage VREFP to vary from its ideal voltage. Amplifier circuit 201 also causes pre-charge reference voltage VPCR to equal or approximately equal the ideal voltage REF.

According to a particular example, the constant current through current source circuit 205 may be two times the constant current through current source circuit 204. As a more specific example that is not intended to be limiting, the constant current through current source circuit 204 may be 50 microamperes, the constant current through current source circuit 205 may be 100 microamperes, transistor 202 may have two times the drain-to-source resistance of transistor 203, the channel width of transistor 203 may be two times larger than the channel width of transistor 202, and supply voltage VCC may be 1.8 volts.

In N-bit DAC circuit 105, capacitors 211 are an array of capacitors that have binary weighted capacitances. Each of capacitors 211, except the smallest capacitor 211A, has twice the capacitance of the next smaller capacitor in the array. Capacitors 211A, 211B, 211C, and 211D, for example, have capacitances of C, 2C, $2^{N-2}$C, and $2^{N-1}$C, respectively, where C is any suitable capacitance value.

The top plates of capacitors 211, including capacitors 211A-211D, generate voltage VDAC and are coupled to the inverting input of comparator circuit 102. The bottom plate of each of capacitors 211 is coupled to a first terminal of a respective one of switch circuits 221. For example, the bottom plates of capacitors 211A, 211B, 211C and 211D are coupled to first terminals of switch circuits 221A, 221B, 221C, and 221D, respectively. The second terminal of each of switch circuits 221, including each of switch circuits 221A-221D, is coupled to node 207 at voltage VREFP. The third terminal of each of switch circuits 221, including each of switch circuits 221A-221D, is coupled to a node at the ground voltage. Node 207 is also coupled to voltage stabilization circuit 107.

Signals SW[N-1:0] include signals SW[0], SW[1], ... SW[N-2], and SW[N-1]. Signals SW[N-1:0] control switch circuits 221. For example, signals SW[0], SW[1], SW[N-2], and SW[N-1] control switch circuits 221A, 221B, 221C, and 221D, respectively. Thus, signals SW[N-1:0] function as switch control signals. Switch control signals SW[N-1:0] cause switch circuits 221 to couple the bottom plates of capacitors 211 either to the node at the ground voltage (as shown for example in FIG. 2) or to node 207 at voltage VREFP. For example, switch control signals SW[0], SW[1], SW[N-2], and SW[N-1] cause switch circuits 221A, 221B, 221C, and 221D to couple the bottom plates of capacitors 211A, 211B, 211C, and 211D, respectively, either to the node at the ground voltage or to node 207 at voltage VREFP.

Figure 3:
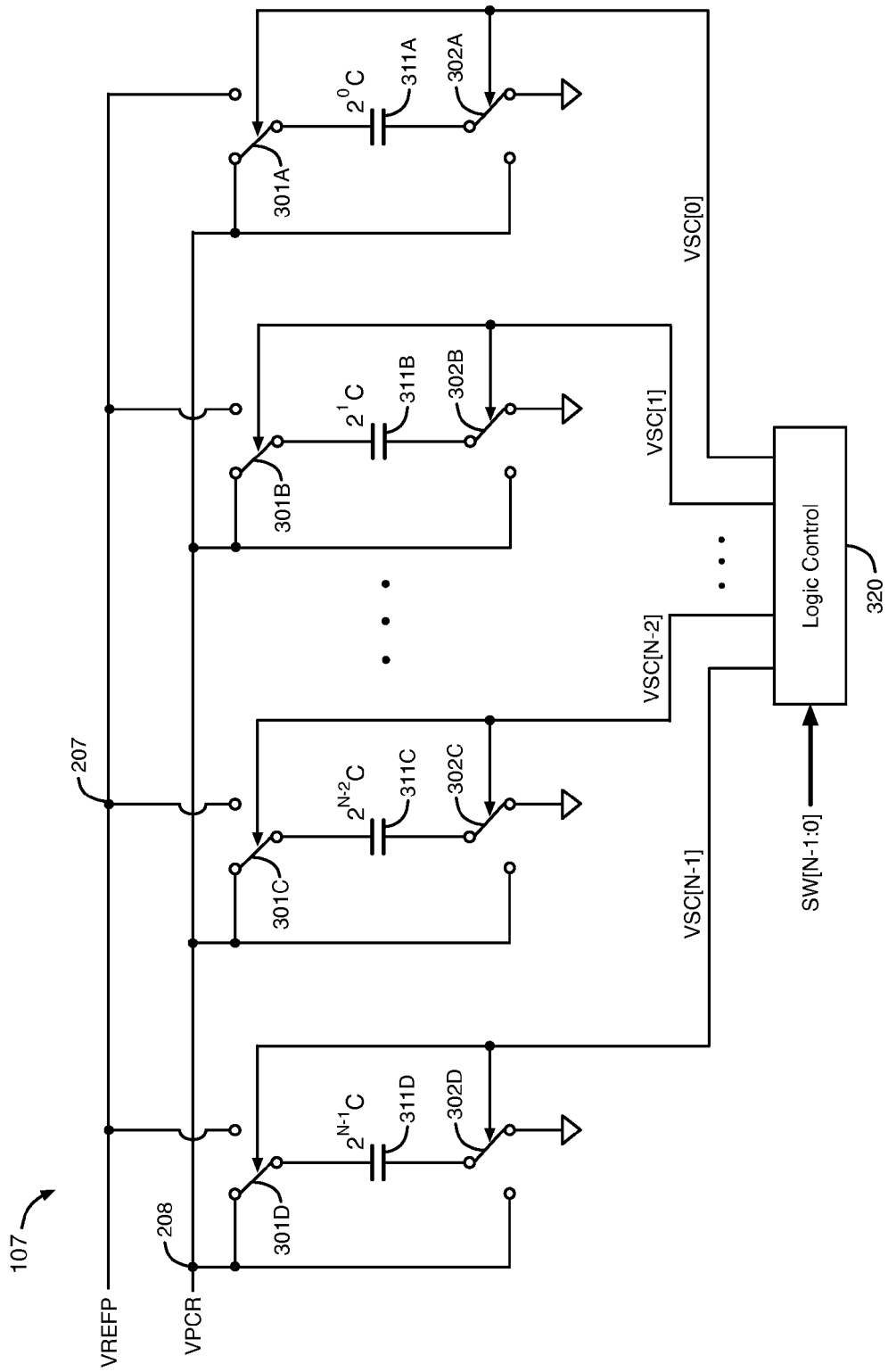
FIG. 3 illustrates further details of the voltage stabilization circuit shown in FIGS. 1-2, according to an embodiment of the present invention.

FIG. 3 illustrates further details of voltage stabilization circuit 107, according to an embodiment of the present invention. In the embodiment of FIG. 3, voltage stabilization circuit 107 includes an N number of switch circuits 301, including switch circuits 301A-301D, an N number of switch circuits 302, including switch circuits 302A-302D, an N number of capacitors 311, including capacitors 311A-311D, and logic control circuit 320. N refers to the same positive integer number in each of FIGS. 1-6.

A first terminal of each of switch circuits 301 is coupled to node 208 at voltage VPCR. A second terminal of each of switch circuits 301 is coupled to node 207 at voltage VREFP. A first terminal of each of switch circuits 302 is coupled to node 208 at voltage VPCR. A second terminal of each of switch circuits 302 is coupled to a node at the ground voltage.

Capacitors 311 are an array of capacitors that have binary weighted capacitances. Each of capacitors 311, except the smallest capacitor 311A, has twice the capacitance of the next smaller capacitor in the array. For example, capacitors 311A, 311B, 311C, and 311D have capacitances of C, 2C, $2^{N-2}$C, and $2^{N-1}$C, respectively, where C is any suitable capacitance value. C represents the same capacitance value in each of FIGS. 2 and 3. Thus, each of capacitors 311 has the same capacitance as a corresponding one of capacitors 211. For example, capacitors 311A, 311B, 311C, and 311D have the same capacitances as capacitors 211A, 211B, 211C, and 211D, respectively.

Switch control signals SW[N-1:0] are provided to inputs of logic control circuit 320. Logic control circuit 320 generates an N number of switch control signals VSC[N-1:0] based on the values of the switch control signals SW[N-1:0]. Switch control signals VSC[N-1:0] include, for example, signals VSC[0], VSC[1], VSC[N-2], and VSC[N-1], as shown in FIG. 3. Switch control signals VSC[N-1:0] are provided to control inputs of switch circuits 301 and 302. Each of the switch control signals VSC[N-1:0] is provided to the control input of one of switch circuits 301 and to the control input of one of switch circuits 302. For example, signals VSC[0], VSC[1], VSC[N-2], and VSC[N-1] are provided to control inputs of switch circuits 301A and 302A, 301B and 302B, 301C and 302C, and 301D and 302D, respectively, as shown in FIG. 3. Switch control signals VSC[N-1:0] control switch circuits 301 and 302. For example, signals VSC[0], VSC[1], VSC[N-2], and VSC[N-1] control switch circuits 301A and 302A, 301B and 302B, 301C and 302C, and 301D and 302D, respectively.

The operation of ADC circuit 100 is now described in further detail. As discussed above, track and hold circuit 101 generates samples of signal AIN in signal VIN at repeating intervals. ADC circuit 100 performs a binary search algorithm on each sample of the analog input signal AIN to generate an approximate digital output that is indicated by output signals DOUT. Prior to the binary search algorithm being performed on each sample of signal AIN, all of the signals SW[N-1:0] are in logic low states. In response to all of signals SW[N-1:0] being in logic low states, all of switch circuits 221 in DAC circuit 105 couple their respective capacitors 211 to the node at the ground voltage, as shown, for example, in FIG. 2.

In response to all of signals SW[N-1:0] being in logic low states, logic control circuit 320 generates logic low states in all of the switch control signals VSC[N-1:0]. In response to the logic low states in all of signals VSC[N-1:0], each of switch circuits 301 couples a respective one of capacitors 311 to node 208 at voltage VPCR and each of switch circuits 302 couples a respective one of capacitors 311 to the node at the ground voltage. For example, in response to all of signals VSC[N-1:0] being in logic low states, switch circuits 301A-301D couple capacitors 311A-311D, respectively, to node 208, and switch circuits 302A-302D couple capacitors 311A-311D, respectively, to the node at the ground voltage, as shown, e.g., in FIG. 3. By coupling all of the capacitors 311 in voltage stabilization circuit 107 between node 208 and the node at the ground voltage, capacitors 311 are pre-charged to the pre-charge reference voltage VPCR, which equals voltage REF.

ADC circuit 100 performs multiple iterations of a binary search algorithm on each sample of the analog input signal AIN. In each iteration of the binary search algorithm, ADC circuit 100 generates an additional bit in digital signals SW[N-1:0] to represent the corresponding sample of signal AIN. After the end of the binary search algorithm, ADC circuit 100 outputs the bits generated in the iterations of the binary search algorithm in digital output signals DOUT.

Each iteration of the binary search algorithm starts with a bit charge redistribution cycle. At the start of the bit charge redistribution cycle for the first iteration of the binary search algorithm performed on a sample of signal AIN, the most significant bit (MSB) of the signals SW[N-1:0] stored in N-bit register circuit 104 is changed to a logic high state (i.e., 1), and the remaining bits of the signals SW[N-1:0] stored in N-bit register circuit 104 remain in logic low states (i.e., 0s). Signal SW[N-1] represents the most significant bit (MSB) of signals SW[N-1:0].

In response to signal SW[N-1] changing to a logic high state, switch circuit 221D switches to couple capacitor 211D to node 207 at voltage VREFP. Switch circuits 221A-221C couple capacitors 211A-211C to the node at the ground voltage in response to signals SW[0], SW[1], and SW[N−2], respectively, being in logic low states. The other switch circuits 221 also couple their respective capacitors 211 to the node at the ground voltage in response to logic low states in the other switch control signals SW. After this configuration of switch circuits 221 is set, the voltage of signal VDAC settles to VREFP/2, because the capacitance of capacitor 211D equals the capacitance of all of the other capacitors 211 added together minus 1.

The bit charge redistribution cycle is a period of time during which the voltage of signal VDAC settles to a voltage that is measured by comparator circuit 102 after one of switch circuits 221 is switched. The analog-to-digital conversion rate of ADC circuit 100 may be determined by the settling time of the voltage of signal VDAC during the bit charge redistribution cycles. The voltage of signal VDAC should settle within the resolution of ADC circuit 100 to ensure the accuracy of output signals DOUT. The resolution of ADC circuit 100 may be, for example, ½ the voltage change in signal VDAC that is caused by switching the switch circuit 221A coupled to the smallest capacitor 211A. The maximum settling time of the voltage of signal VDAC typically occurs during the first iteration of the binary search algorithm, because capacitor 211D has the largest capacitance in the capacitor array 211. Also, the largest change in the voltage of signal VDAC typically occurs in response to switching switch circuit 221D based on a change in the MSB signal SW[N−1].

Figure 4:
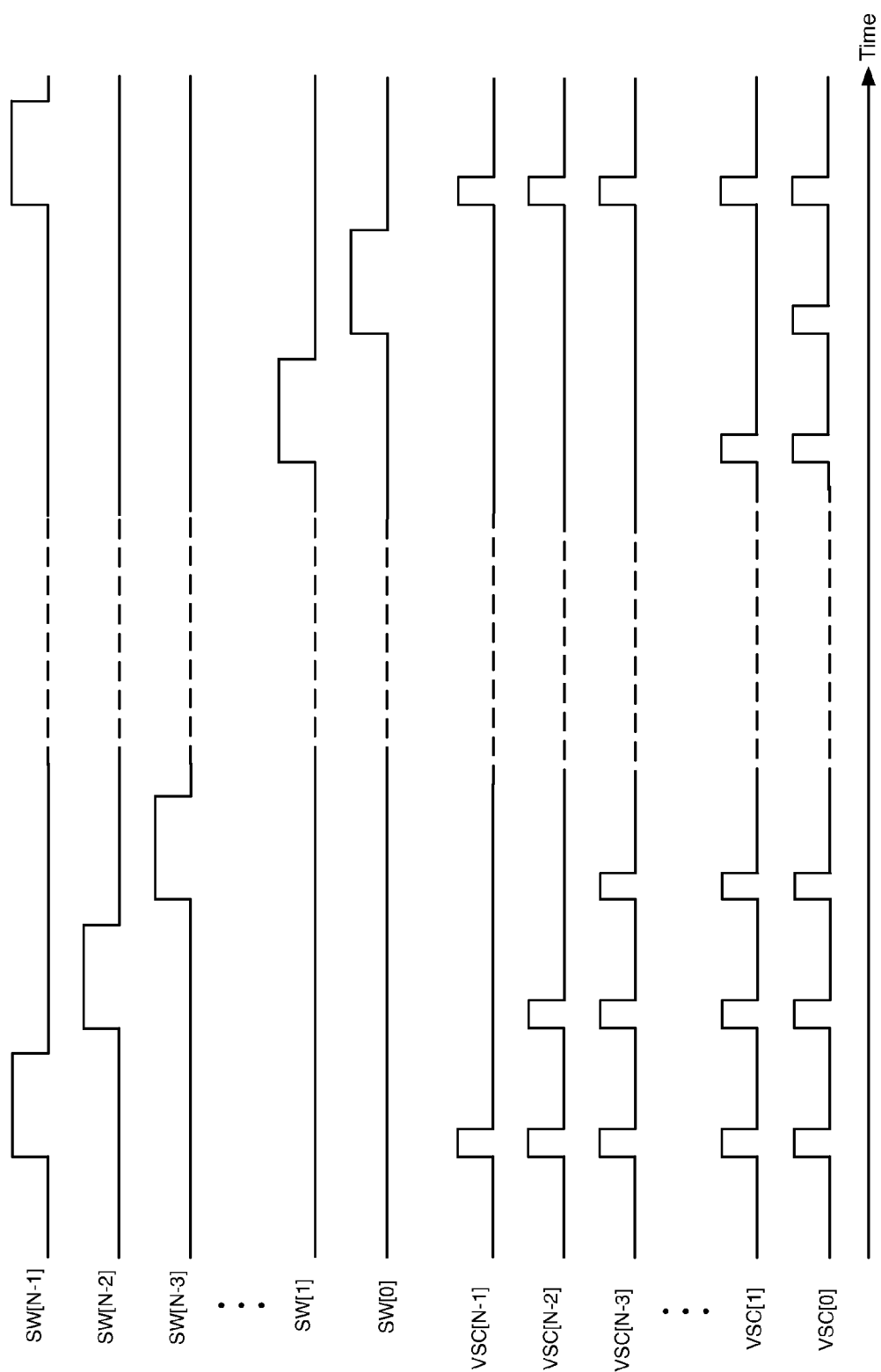
FIG. 4 is a diagram that illustrates examples of voltage waveforms for subsets of the switch control signals shown in FIGS. 2-3, according to an embodiment of the present invention.

In response to the MSB signal SW[N−1] changing to a logic high state, logic control circuit 320 generates a logic high pulse in each of the signals VSC[N−1:0]. FIG. 4 is a diagram that illustrates examples of voltage waveforms for a subset of the switch control signals SW[N−1:0] and for a subset of the switch control signals VSC[N−1:0], according to an embodiment of the present invention. As shown in FIG. 4, logic control circuit 320 generates logic high pulses in signals VSC[N−1:0] in response to a rising edge in signal SW[N−1]. In the embodiment of FIG. 4, the logic high pulses in signals VSC[N−1:0] are short relative to the logic high pulses in signals SW[N−1:0].

In response to the logic high pulses in signals VSC[N−1:0], each of the switch circuits 301 in voltage stabilization circuit 107 switches to couple the top plate of a respective capacitor 311 to node 207. Also, in response to the logic high pulses in signals VSC[N−1:0], each of switch circuits 302 in voltage stabilization circuit 107 switches to couple the bottom plate of a respective capacitor 311 to node 208. For example, switch circuits 301A-301D switch to couple capacitors 311A-311D, respectively, to node 207, and switch circuits 302A-302D switch to couple capacitors 311A-311D, respectively, to node 208 in response to the logic high pulses in signals VSC[N−1:0].

As mentioned above, capacitors 311 are pre-charged to the pre-charge reference voltage VPCR, which equals the ideal reference voltage REF. Coupling capacitors 311 between nodes 207 and 208 during the bit charge redistribution cycle reduces the time for reference voltage VREFP to settle to its ideal voltage REF. As a result, the voltage of signal VDAC settles to its target voltage faster, and ADC circuit 100 may operate at a faster analog-to-digital conversion rate. Voltage stabilization circuit 107 may increase and/or decrease reference voltage VREFP to cause reference voltage VREFP to settle to its ideal voltage REF in less time. Voltage stabilization circuit 107 reduces variations in reference voltage VREFP. Voltage stabilization circuit 107 reduces changes in reference voltage VREFP at node 207 that are caused by switching one or more of switch circuits 221. The charge loss in voltage VREFP from charging the capacitor array 211 equals C×REF. Because the charge loss in voltage VREFP from charging capacitor array 211 equals C×REF, capacitors 311 are pre-charged to voltage VPCR, and the capacitances of capacitors 311 are set to equal the capacitances of corresponding capacitors 211 in DAC circuit 105. For example, the capacitances of capacitors 311A-311D equal the capacitances of capacitors 211A-211D, respectively. Voltage stabilization circuit 107 does not over-boost or under-boost voltage VREFP across variations in the process, the supply voltage, and the temperature (i.e., PVT variations) of ADC circuit 100.

Figure 5A:
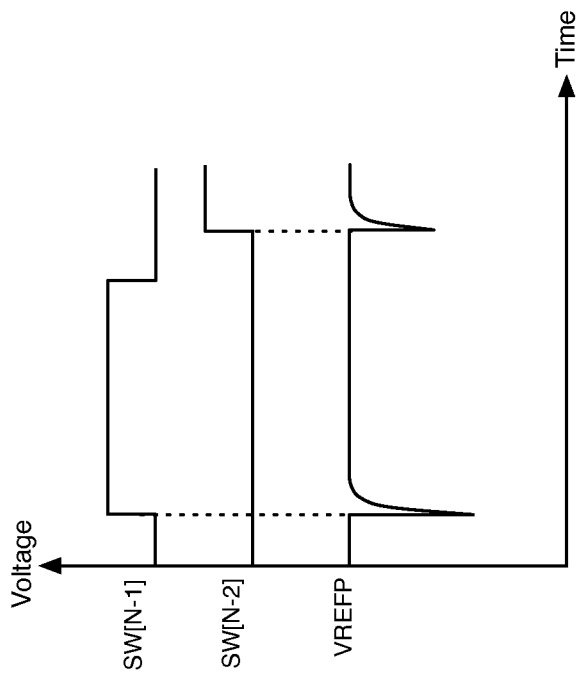
FIG. 5A is a diagram that illustrates examples of voltage waveforms for two switch control signals and a reference voltage using a SAR ADC circuit without a voltage stabilization circuit.

FIG. 5A is a diagram that illustrates examples of voltage waveforms for signals SW[N−1] and SW[N−2] and voltage VREFP using a SAR ADC circuit without a voltage stabilization circuit. As shown in FIG. 5A, after switch circuit 221D switches in response to a rising edge in signal SW[N−1], voltage VREFP drops significantly, then overshoots its initial voltage, and then decreases towards its initial voltage, which equals voltage REF. However, voltage VREFP remains above its initial voltage by a voltage offset before the end of the bit charge redistribution cycle in this example, which occurs before the next rising edge in signal SW[N−2], as shown in FIG. 5A.

Figure 5B:
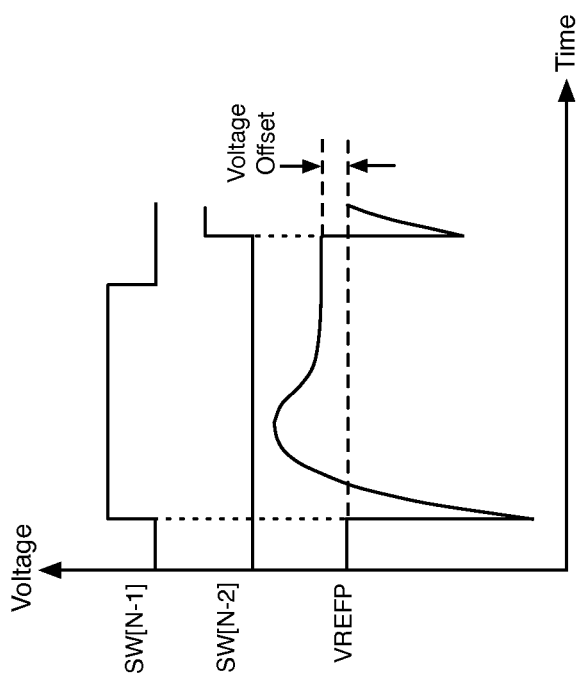
FIG. 5B is a diagram that illustrates examples of voltage waveforms for the two switch control signals and the reference voltage using the ADC circuit of FIG. 1, according to an embodiment of the present invention.

FIG. 5B is a diagram that illustrates examples of voltage waveforms for signals SW[N−1] and SW[N−2] and voltage VREFP using ADC circuit 100 with voltage stabilization circuit 107, according to an embodiment of the present invention. As shown in FIG. 5B, after switch circuit 221D switches in response to a rising edge in signal SW[N−1], voltage stabilization circuit 107 causes voltage VREFP to decrease less than the waveform shown in FIG. 5A. Also, voltage stabilization circuit 107 causes voltage VREFP to return to its initial voltage more quickly without a significant overshoot than the waveform shown in FIG. 5A. Voltage stabilization circuit 107 causes voltage VREFP to equal or approximately equal its initial voltage without a significant offset before the end of the bit charge redistribution cycle of one of, a subset of, or all of the iterations of the binary search algorithm. As a result, voltage stabilization circuit 107 causes the voltage of signal VDAC to be at or closer to its target voltage (e.g., VREFP/2 for the first iteration) by the end of the bit charge redistribution cycle of one of, a subset of, or all of the iterations of the binary search algorithm.

Figure 6:
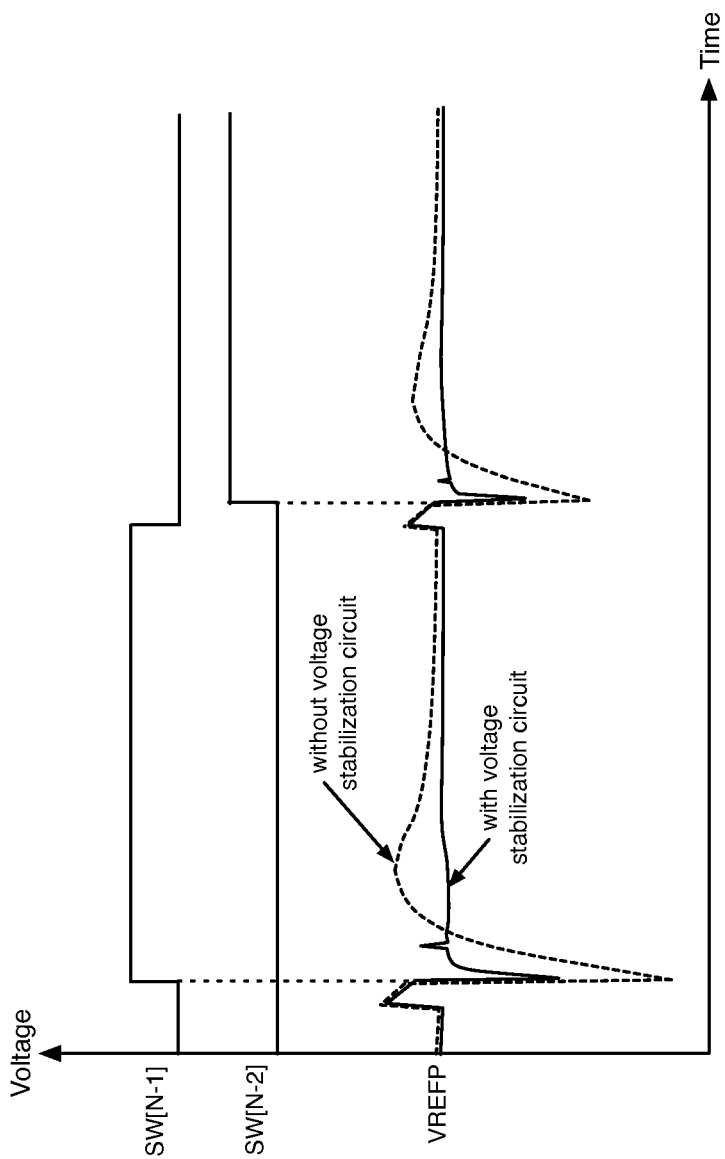
FIG. 6 is another diagram that illustrates examples of voltage waveforms for the two switch control signals and the reference voltage, according to an embodiment of the present invention.

FIG. 6 is another diagram that illustrates examples of voltage waveforms for signals SW[N−1] and SW[N−2] and voltage VREFP, according to an embodiment of the present invention. In FIG. 6, the solid line for VREFP indicates the voltage of VREFP in ADC circuit 100 with voltage stabilization circuit 107, and the dotted line for VREFP indicates the voltage of VREFP in a SAR ADC circuit without a voltage stabilization circuit. As shown in FIG. 6, voltage stabilization circuit 107 causes voltage VREFP to settle back to its initial voltage faster after one of switch circuits 221 switches to couple a respective one of capacitors 211 to node 207. Voltage stabilization circuit 107 reduces variations in voltage VREFP that are caused by switching one or more of switch circuits 221.

In response to the start of the logic high pulse in signal SW[N−1], logic control circuit 320 generates a logic high pulse having a short duration in each of signals VSC[N−1:0], as shown in FIG. 4. At the end of the logic high pulses in signals VSC[N−1:0], logic control circuit 320 generates a falling edge in each of signals VSC[N−1:0], as shown in FIG. 4. In response to the falling edges in signals VSC[N−1:0], each of the switch circuits 301 switches to couple the top plate of a respective capacitor 311 to node 208 again, and each of switch circuits 302 switches to couple the bottom plate of a respective capacitor 311 to the node at the ground voltage again. For example, switch circuits 301A-301D switch to couple capacitors 311A-311D, respectively, to node 208, and switch circuits 302A-302D switch to couple capacitors 311A-311D, respectively, to the node at the ground voltage in response to the falling edges in signals VSC[N−1:0].

At or near the end of the bit charge redistribution cycle, comparator circuit 102 compares the voltage of signal VIN to the voltage of signal VDAC to generate signal COUT. If the voltage of signal VIN is greater than the voltage of signal VDAC, comparator circuit 102 causes its output signal COUT to be in a logic high state (i.e., 1). If comparator circuit 102 causes its output signal COUT to be in a logic high state after comparing VIN and VDAC in the first iteration of the binary search algorithm, SAR logic circuit 103 causes the MSB signal SW[N−1] stored in N-bit register circuit 104 to remain in the logic high state.

If the voltage of signal VIN is less than the voltage of signal VDAC, comparator circuit 102 causes its output signal COUT to be in a logic low state (i.e., 0). If comparator circuit 102 causes its output signal COUT to be in a logic low state after comparing VIN and VDAC in the first iteration of the binary search algorithm, SAR logic circuit 103 clears the MSB signal SW[N−1] stored in N-bit register circuit 104 to a logic low state, as shown, for example, in FIG. 4. Switch circuit 221D switches to couple capacitor 211D to the node at the ground voltage in response to MSB signal SW[N−1] changing back to a logic low state.

At the start of the bit charge redistribution cycle for the second iteration of the binary search algorithm performed on a sample of signal AIN, the MSB signal SW[N−1] remains in the logic state determined in the first iteration, and the second most significant bit (MSB) of signals SW[N−1:0] is changed to a logic high state. Signal SW[N−2] represents the second MSB signal of signals SW[N−1:0]. The remaining N−2 signals of signals SW[N−1:0] remain in logic low states.

In response to signal SW[N−2] changing to a logic high state, switch circuit 221C switches to couple capacitor 211C to node 207 at voltage VREFP. Switch circuit 221D couples capacitor 211D to either the node at the ground voltage or to node 207, depending on the logic state of MSB signal SW[N−1] determined in the first iteration. Switch circuits 221A-221B couple capacitors 211A-211B to the node at the ground voltage in response to signals SW[0] and SW[1], respectively, being in logic low states. The remaining switch circuits 221 also couple their respective capacitors 211 to the node at the ground voltage in response to logic low states in the other signals SW.

Coupling capacitor 211C to node 207 at voltage VREFP increases the voltage of signal VDAC by VREFP/4. Thus, if switch circuit 221D couples capacitor 211D to the node at the ground voltage during the second iteration, the voltage of signal VDAC settles to VREFP/4 at the end of the bit charge redistribution cycle. If switch circuit 221D couples capacitor 211D to node 207 at voltage VREFP during the second iteration, the voltage of signal VDAC settles to 3×VREFP/4 at the end of the bit charge redistribution cycle. The voltage of signal VDAC settles to the target voltage shown in equation (1) below at the end of the bit charge redistribution cycle in a corresponding iteration of the binary search algorithm.

$$VDAC = (SW[N-1] \times VREFP/2) + (SW[N-2] \times VREFP/4) + \ldots + (SW[1] \times VREFP/2^{N-2}) + (SW[0] \times VREFP/2^{N-1})$$ (1)

In response to signal SW[N−2] changing to a logic high state, logic control circuit 320 generates logic high pulses in signals VSC[N−2:0] and maintains signal VSC[N−1] in a logic low state. As shown in FIG. 4, logic control circuit 320 generates logic high pulses in signals VSC[N−2], VSC[N−3], . . . VSC[1], and VSC[0] in response to a rising edge in signal SW[N−2].

In response to the logic high pulses in signals VSC[N−2:0], switch circuits 301A-301C switch to couple the top plates of capacitors 311A-311C, respectively, to node 207, and switch circuits 302A-302C switch to couple the bottom plates of capacitors 311A-311C, respectively, to node 208. In response to signal VSC[N−1] remaining in a logic low state, switch circuits 301D and 302D continue to couple capacitor 311D between node 208 and the node at the ground voltage.

Coupling capacitors 311A-311C between nodes 207 and 208 during the bit charge redistribution cycle reduces the time for voltage VREFP to settle to its ideal voltage. Capacitors 311A-311C reduce variations in reference voltage VREFP at node 207 that are caused by switching switch circuit 221C to couple capacitor 211C to node 207.

At the end of the logic high pulses in signals VSC[N−2:0], logic control circuit 320 generates a falling edge in each of signals VSC[N−2:0], as shown in FIG. 4. In response to the falling edges in signals VSC[N−2:0], switch circuits 301A-301C switch to couple capacitors 311A-311C, respectively, to node 208, and switch circuits 302A-302C switch to couple capacitors 311A-311C, respectively, to the node at the ground voltage.

At or near the end of the bit charge redistribution cycle, comparator circuit 102 compares the voltage of signal VIN to the voltage of signal VDAC to generate signal COUT in the second iteration of the binary search algorithm. If the voltage of signal VIN is greater than the voltage of signal VDAC, comparator circuit 102 causes its output signal COUT to be in a logic high state. If comparator circuit 102 causes its output signal COUT to be in a logic high state after comparing signals VIN and VDAC during the second iteration of the binary search algorithm, SAR logic circuit 103 causes the second MSB signal stored in N-bit register circuit 104 (i.e., signal SW[N−2]) to remain in the logic high state.

If the voltage of signal VIN is less than the voltage of signal VDAC, comparator circuit 102 causes its output signal COUT to be in a logic low state. If comparator circuit 102 causes its output signal COUT to be in a logic low state after comparing signals VIN and VDAC in the second iteration of the binary search algorithm, SAR logic circuit 103 clears the second MSB signal stored in N-bit register circuit 104 (i.e., signal SW[N−2]) to a logic low state, as shown, for example, in FIG. 4. Switch circuit 221C switches to couple capacitor 211C to the node at the ground voltage in response to signal SW[N−2] returning to the logic low state.

The process described above for the first and second iterations is repeated in an additional iteration of the binary search algorithm for each of the third and subsequent most significant bits of signals SW[N−1:0]. At the start of the bit charge redistribution cycle for the second to last iteration of the binary search algorithm performed on a sample of signal AIN, signals SW[N−1:2] remain in the logic states determined in the previous iterations, signal SW[1] is changed to a logic high state, and signal SW[0] remains in a logic low state. Signal SW[0] is the least significant bit (LSB) of signals SW[N−1:0], and signal SW[1] is the second LSB of signals SW[N−1:0].

In response to signal SW[1] changing to a logic high state, switch circuit 221B switches to couple capacitor 211B to node 207 at voltage VREFP. Coupling capacitor 211B between the node at voltage VDAC and node 207 increases voltage VDAC by VREFP/$2^{N-2}$ during the bit charge redistribution cycle. Switch circuit 221A continues to couple capacitor 211A to the node at the ground voltage. The remaining switch circuits 221 in DAC circuit 105 are configured based on the logic states of signals SW[N−1:2] that were determined in the previous iterations of the binary search algorithm.

In response to a rising edge in signal SW[1], logic control circuit 320 generates logic high pulses in signals VSC[1] and VSC[0] and maintains signals VSC[N−1:2] in logic low states, as shown in FIG. 4. In response to the logic high pulses in signals VSC[1] and VSC[0], switch circuits 301A-301B switch to couple the top plates of capacitors 311A-311B, respectively, to node 207, and switch circuits 302A-302B switch to couple the bottom plates of capacitors 311A-311B, respectively, to node 208. In response to signals VSC[N−1:2] remaining in logic low states, switch circuits 301C-301D etc. and 302C-302D etc. continue to couple capacitors 311C-311D etc., respectively, between node 208 and the node at the ground voltage.

Coupling capacitors 311A-311B between nodes 207 and 208 during the bit charge redistribution cycle reduces the time for voltage VREFP to settle to its ideal voltage. Capacitors 311A-311B reduce variations in reference voltage VREFP at node 207 that are caused by switching switch circuit 221B to couple capacitor 211B to node 207.

At the end of the logic high pulses in signals VSC[1] and VSC[0], logic control circuit 320 generates falling edges in signals VSC[1] and VSC[0], as shown in FIG. 4. In response to the falling edges in signals VSC[1] and VSC[0], switch circuits 301A-301B switch to couple capacitors 311A-311B, respectively, to node 208, and switch circuits 302A-302B switch to couple capacitors 311A-311B, respectively, to the node at the ground voltage.

At or near the end of the bit charge redistribution cycle in the second to last iteration of the binary search algorithm, comparator circuit 102 compares the voltages of signals VDAC and VIN to generate an updated value for signal COUT. SAR logic circuit 103 then determines whether to maintain signal SW[1] in a logic high state or whether to clear signal SW[1] to a logic low state based on whether the updated value of signal COUT is a logic high or low state, respectively. FIG. 4 shows signal SW[1] being cleared to a logic low state as an example.

At the start of the bit charge redistribution cycle for the last iteration of the binary search algorithm performed on a sample of signal AIN, signals SW[N−1:1] remain in the logic states determined in the previous iterations, and signal SW[0] is changed to a logic high state. In response to the rising edge in signal SW[0], switch circuit 221A switches to couple capacitor 211A to node 207 at voltage VREFP. Coupling capacitor 211A between the node at voltage VDAC and node 207 increases voltage VDAC by VREFP/$2^{N-1}$ during the bit charge redistribution cycle. The remaining switch circuits 221 in DAC circuit 105 are configured based on the logic states of signals SW[N−1:1] that were determined in the previous iterations of the binary search algorithm.

In response to a rising edge in signal SW[0], logic control circuit 320 generates a logic high pulse in signal VSC[0] and maintains signals VSC[N−1:1] in logic low states, as shown in FIG. 4. In response to the logic high pulse in signal VSC[0], switch circuit 301A switches to couple the top plate of capacitor 311A to node 207, and switch circuit 302A switches to couple the bottom plate of capacitor 311A to node 208. In response to signals VSC[N−1:1] remaining in logic low states, switch circuits 301B-301D etc. and 302B-302D etc. continue to couple capacitors 311B-311D etc., respectively, between node 208 and the node at the ground voltage.

Coupling capacitor 311A between nodes 207 and 208 during the bit charge redistribution cycle reduces the time for reference voltage VREFP to settle to its ideal voltage. Capacitor 311A reduces variations in reference voltage VREFP at node 207 that are caused by switching switch circuit 221A to couple capacitor 211A to node 207. In response to the falling edge at the end of the logic high pulse in signal VSC[0], switch circuit 301A switches to couple capacitor 311A to node 208, and switch circuit 302A switches to couple capacitor 311A to the node at the ground voltage.

At or near the end of the bit charge redistribution cycle in the last iteration of the binary search algorithm, comparator circuit 102 compares the voltages of signals VDAC and VIN to generate an updated value for signal COUT. SAR logic circuit 103 then determines whether to maintain signal SW[0] in a logic high state or whether to clear signal SW[0] to a logic low state based on whether the updated value of signal COUT is a logic high or low state, respectively.

After the last iteration, ADC circuit 100 has completed the binary search algorithm for a sample of signal AIN. The logic state determined for each of signals SW[N−1:0] in a respective iteration of the binary search algorithm is then provided in a corresponding one of the output signals DOUT. Signals DOUT then indicate final digital values for the sample of signal AIN.

ADC circuit 100 may then sample signal AIN again to generate the next sample of signal AIN in signal VIN. ADC circuit 100 then converts the next sample of signal AIN into a set of digital signals in output signals DOUT using the binary search algorithm described above. The logic states of all of signals SW[N−1:0] are cleared to logic low states before ADC circuit 100 begins the binary search algorithm on the next sample of signal AIN.

Figure 7:
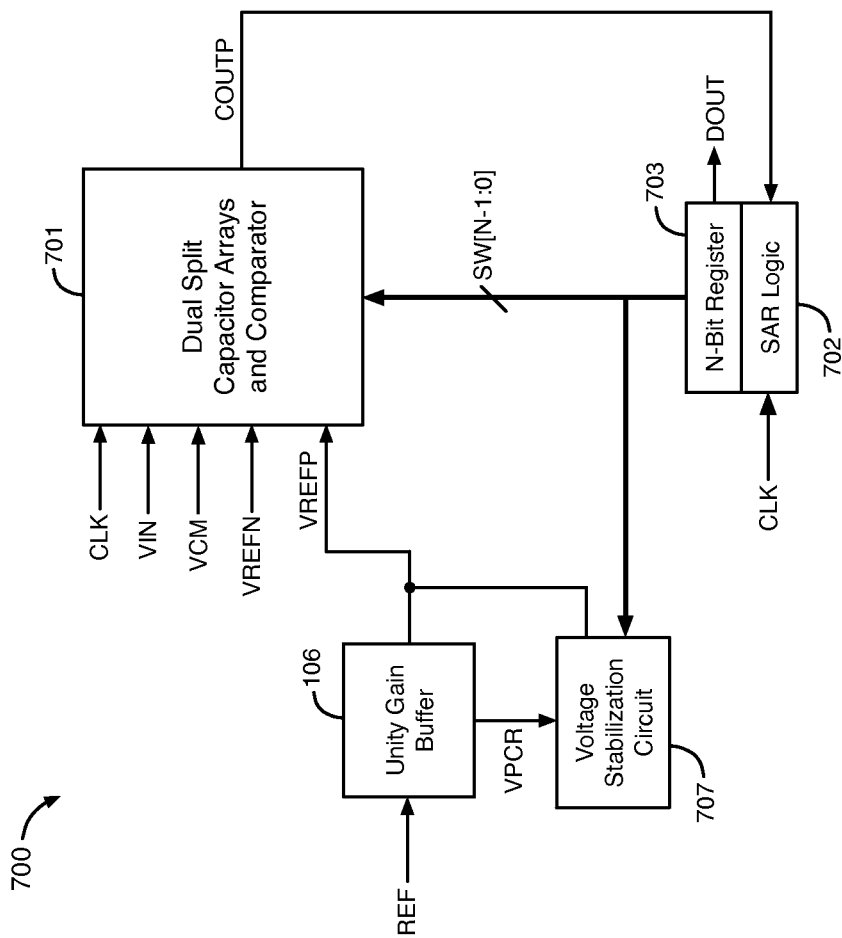
FIG. 7 illustrates an example of an analog-to-digital converter (ADC) circuit having dual split capacitor arrays and a voltage stabilization circuit, according to another embodiment of the present invention.

FIG. 7 illustrates an example of an analog-to-digital converter (ADC) circuit 700 having dual split capacitor arrays and a voltage stabilization circuit, according to another embodiment of the present invention. ADC circuit 700 is a successive approximation register (SAR) ADC circuit. ADC circuit 700 includes unity gain buffer circuit 106, voltage stabilization circuit 707, dual split capacitor arrays and comparator circuit 701, SAR logic circuit 702, and N-bit register circuit 703. Unity gain buffer circuit 106 functions as described above with respect to FIGS. 1-2 to generate voltages VREFP and VPCR. ADC circuit 700 may be in an integrated circuit.

The pre-charge reference voltage VPCR is provided to an input of voltage stabilization circuit 707. An N number of digital signals SW[N−1:0] are provided to additional inputs of voltage stabilization circuit 707. In ADC circuit 700, N is the number of bits/signals in signals SW[N−1:0] and the number of bits/signals in signals DOUT. N may be any positive integer number. Voltage stabilization circuit 707 reduces variations in voltage VREFP based on the pre-charge reference voltage VPCR in response to the digital signals SW[N−1:0], as described below.

Signals CLK and VIN and voltages VCM, VREFN, and VREFP are provided to inputs of dual split capacitor arrays and comparator circuit 701. Signal CLK is a periodic clock signal. Signal VIN is an input analog voltage signal. ADC circuit 700 converts analog signal VIN to digital output signals DOUT. The voltage of VCM equals half the full scale voltage of ADC circuit 700 (e.g., one-half of supply voltage VCC). VREFN is a low reference voltage. As an example, the reference voltage VREFP may equal half the full scale voltage of ADC circuit 700 that is provided to unity gain buffer circuit 106.

Dual split capacitor arrays and comparator circuit 701 includes a track and hold circuit that samples input signal VIN to generate a sampled voltage of signal VIN. Circuit 701 includes an N-bit digital-to-analog converter (DAC) circuit that converts an N number of digital signals SW[N−1:0] to an analog voltage based on the sampled voltage of signal VIN and based on reference voltages VREFP and VREFN. The comparator circuit in circuit 701 compares the analog voltage generated by the DAC circuit to a voltage that is based on reference voltage VREFP to generate a comparison signal COUTP in response to clock signal CLK.

The comparison signal COUTP is provided to an input of SAR logic circuit 702. SAR logic circuit 702 generates a digital output based on comparison signal COUTP in response to clock signal CLK. The digital output of SAR logic circuit 702 is stored in the N-bit register circuit 703 as the N number of digital signals SW[N−1:0].

ADC circuit 700 performs a binary search algorithm on each sample of the analog input signal VIN to generate a digital output that is indicated by an N number of digital output signals DOUT. Further details of the binary search algorithm performed by ADC circuit 700 are described below. After the analog-to-digital conversion is complete for each sample of the analog input signal VIN, N-bit register circuit 703 outputs the final digital output of SAR logic circuit 702 as output signals DOUT. Output signals DOUT represent the digital value of a corresponding sample of the analog input signal VIN.

Figure 8:
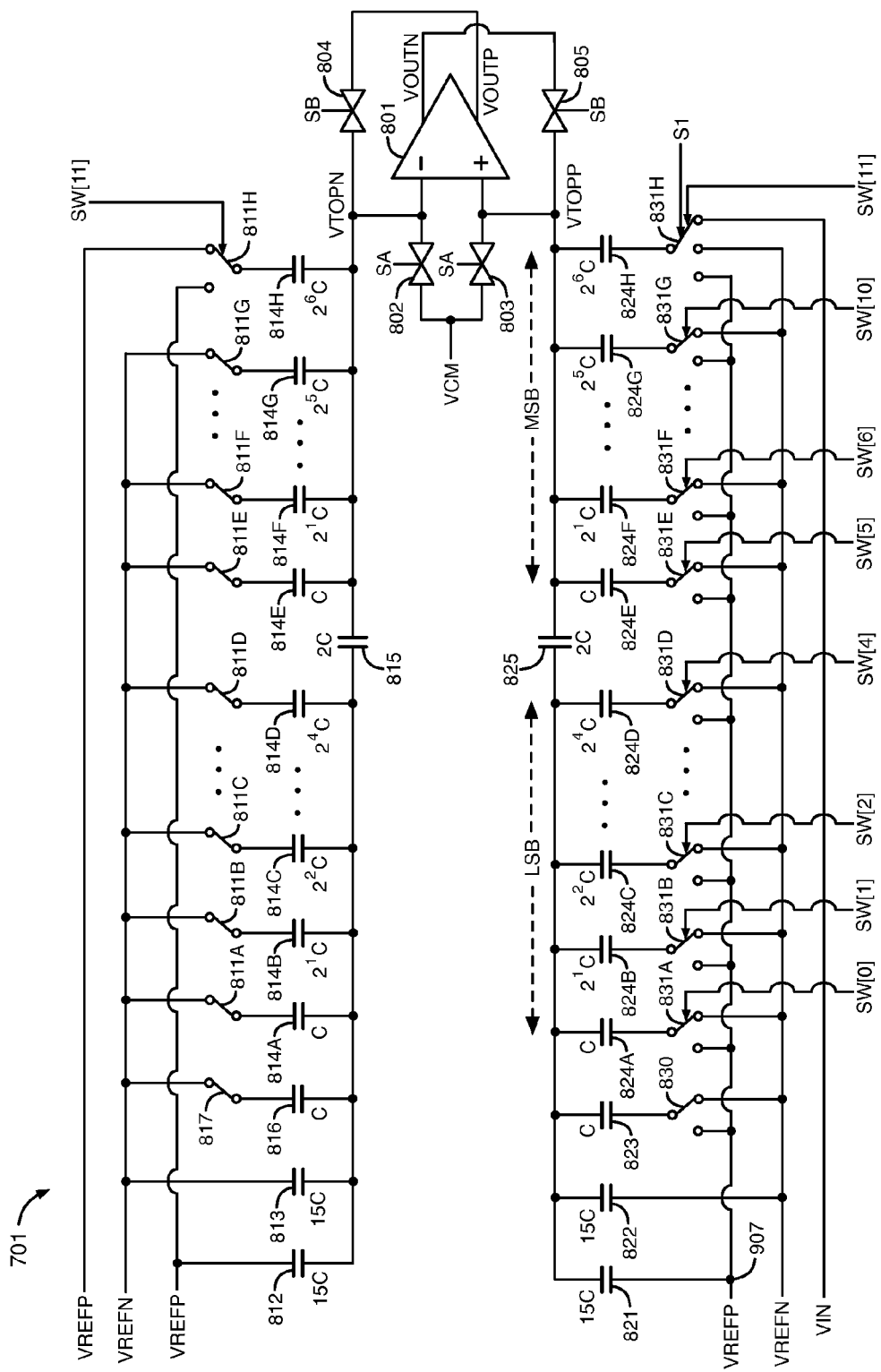
FIG. 8 illustrates further details of the dual split capacitor arrays and comparator circuit shown in FIG. 7, according to an embodiment of the present invention.

FIG. 8 illustrates further details of dual split capacitor arrays and comparator circuit 701 in ADC circuit 700, according to an embodiment of the present invention. Circuit 701 includes comparator circuit 801, pass gate circuits 802-805, 12 switch circuits 811, switch circuit 817, switch circuit 830, 12 switch circuits 831, capacitors 812-813 and 815-816, capacitors 821-823 and 825, 12 capacitors 814, and 12 capacitors 824. The N-bit DAC circuit in circuit 701 includes capacitors 824 and 825 and switch circuits 831.

Of the 12 switch circuits 811, the 12 switch circuits 831, the 12 capacitors 814, and the 12 capacitors 824, only 8 switch circuits 811A-811H, only 8 switch circuits 831A-831H, only 8 capacitors 814A-814H, and only 8 capacitors 824A-824H, respectively, are shown in FIG. 8 to simplify the drawing. In the embodiment of FIG. 8, the number N of bits/signals in signals SW and in signals DOUT equals 12. In alternative embodiments, N may equal any positive integer, and circuit 701 includes an N number of each set of switch circuits 811, capacitors 814, capacitors 824, and switch circuits 831.

Circuit 701 includes two split capacitor arrays. Each of the split capacitor arrays is separated by an attenuation capacitor into two sub-arrays. The first split capacitor array includes capacitors 812-816. Attenuation capacitor 815 splits the first split capacitor array into a first sub-array that has 7 capacitors, including capacitors 814E-814H, and a second sub-array that has 8 capacitors, including capacitors 812-813, 814A-814D, and 816.

The 5 capacitors 814 within the second sub-array have binary weighted capacitances equal to C, 2C, 4C, 8C, and 16C. For example, capacitors 814A, 814B, 814C, and 814D have capacitances of C, 2C, 4C, and $2^4$C, respectively. C is any suitable capacitance value and indicates the same value for all capacitors shown in FIG. 8. The 7 capacitors 814 within the first sub-array have binary weighted capacitances of C, $2^1$C, $2^2$C, $2^3$C, $2^4$C, $2^5$C, and $2^6$C. For example, capacitors 814E, 814F, 814G, and 814H have capacitances of C, 2C, $2^5$C, and $2^6$C, respectively.

The second split capacitor array includes capacitors 821-825. Attenuation capacitor 825 splits the second capacitor array into a first sub-array that has 7 capacitors, including capacitors 824E-824H and a second sub-array that has 8 capacitors, including capacitors 821-823 and 824A-824D. The 5 capacitors 824 in the second sub-array of the second split capacitor array, including capacitors 824A-824D, are used to generate the least significant bits (LSB) of the digital output signals DOUT. The 7 capacitors 824 in the first sub-array of the second split capacitor array, including capacitors 824E-824H, are used to generate the most significant bits (MSB) of the digital output signals DOUT.

The 5 capacitors 824 within the second LSB sub-array have binary weighted capacitances equal to C, 2C, 4C, 8C, and 16C. For example, capacitors 824A, 824B, 824C, and 824D have capacitances of C, 2C, 4C, and $2^4$C, respectively. The 7 capacitors 824 within the first MSB sub-array have binary weighted capacitances of C, $2^1$C, $2^2$C, $2^3$C, $2^4$C, $2^5$C, and $2^6$C. For example, capacitors 824E, 824F, 824G, and 824H have capacitances of C, 2C, $2^5$C, and $2^6$C, respectively.

The attenuation capacitors 815 and 825 reduce the effective capacitances of the capacitors in the second sub-arrays. Attenuation capacitor 815 causes the first split capacitor array to function as a binary weighted capacitor array, even though the capacitors 814 in the first and second sub-arrays are not binary weighted in combination. Attenuation capacitor 825 causes the second split capacitor array to function as a binary weighted capacitor array, even though the capacitors 824 in the first and second sub-arrays are not binary weighted in combination. The split capacitor arrays significantly reduce the die area of circuit 701, because the capacitances of the capacitors in the first sub-arrays are smaller than corresponding capacitors in a standard binary weighted capacitor array having the same number of capacitors as each split capacitor array.

According to an exemplary embodiment, each of the attenuation capacitors 815 and 825 has a capacitance equal to 2×C, and each of the capacitors 812, 813, 821, and 822 has a capacitance equal to 15×C. Capacitors 812, 813, 815, 821, 822, and 825 may have other ratios in other embodiments. Capacitors 816 and 823 each has a capacitance equal to C.

Figure 9:
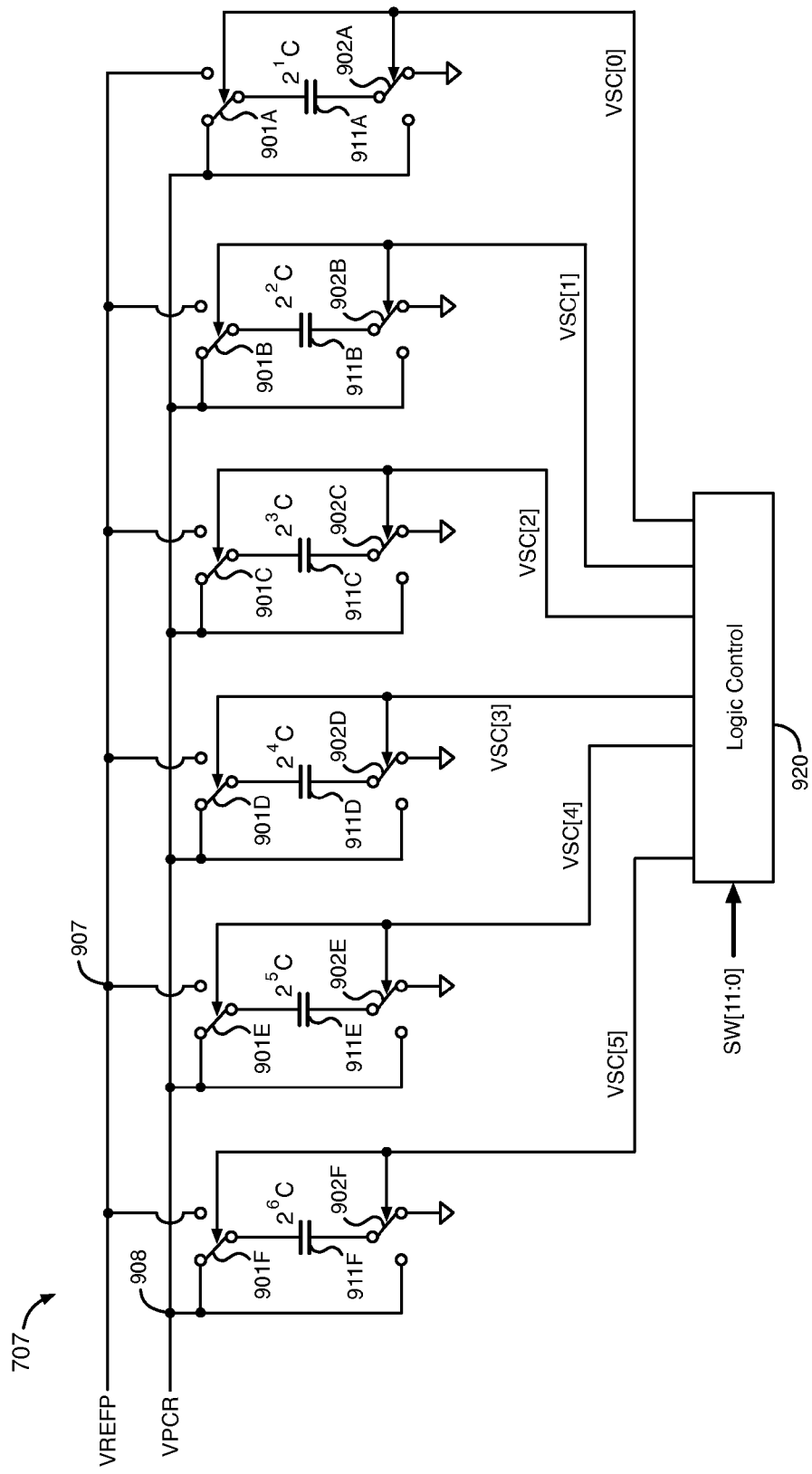
FIG. 9 illustrates further details of the voltage stabilization circuit shown in FIG. 7, according to an embodiment of the present invention.

FIG. 9 illustrates further details of voltage stabilization circuit 707, according to an embodiment of the present invention. In the embodiment of FIG. 9, voltage stabilization circuit 707 includes 6 switch circuits 901A-901F, 6 switch circuits 902A-902F, 6 capacitors 911A-911F, and logic control circuit 920. According to other embodiments, voltage stabilization circuit 707 may have any suitable number of capacitors and corresponding switch circuits.

A first terminal of each of switch circuits 901A-901F is coupled to node 908 at voltage VPCR. A second terminal of each of switch circuits 901A-901F is coupled to node 907 at voltage VREFP. A first terminal of each of switch circuits 902A-902F is coupled to node 908 at voltage VPCR. A second terminal of each of switch circuits 902A-902F is coupled to a node at the ground voltage.

Capacitors 911A-911F are an array of capacitors that have binary weighted capacitances of 2C, $2^2$C, $2^3$C, $2^4$C, $2^5$C, and $2^6$C, respectively. C represents the same capacitance value in FIGS. 8 and 9. Each of capacitors 911A-911F has the same capacitance as one or two of capacitors 824. According to various embodiments, voltage stabilization circuit 707 includes one capacitor 911 and two switch circuits 901 and 902 for each unique capacitance of capacitors 824 in circuit 701, except for capacitors 824A and 824E.

Twelve switch control signals SW[11:0] are provided to inputs of logic control circuit 920. Logic control circuit 920 generates 6 switch control signals VSC[5:0] based on switch control signals SW[11:0]. Switch control signals VSC[0], VSC[1], VSC[2], VSC[3], VSC[4], and VSC[5] are provided to control inputs of switch circuits 901A-901F and switch circuits 902A-902F, respectively, as shown in FIG. 9. Switch control signals VSC[0], VSC[1], VSC[2], VSC[3], VSC[4], and VSC[5] control switch circuits 901A-901F and switch circuits 902A-902F, respectively.

Figure 10:
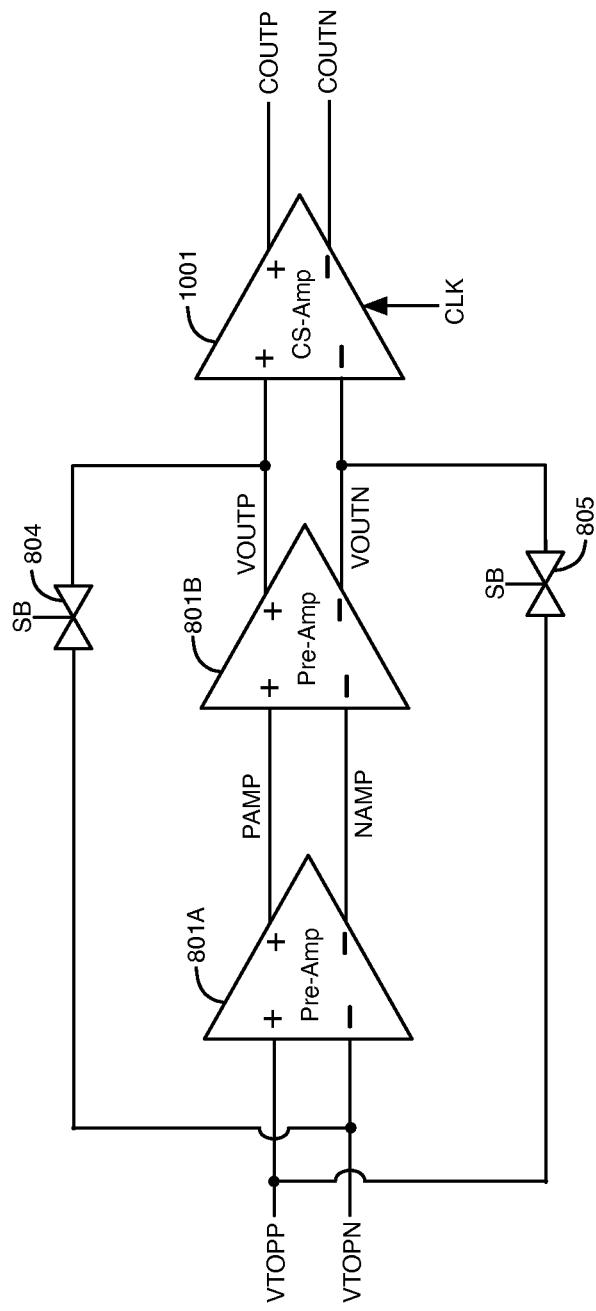
FIG. 10 illustrates further details of the comparator circuit shown in FIG. 8, according to an embodiment of the present invention.

FIG. 10 illustrates further details of a portion of dual split capacitor arrays and comparator circuit 701, according to an embodiment of the present invention. In the embodiment of FIG. 10, comparator circuit 801 includes pre-amplifier circuits 801A and 801B, and dual split capacitor arrays and comparator circuit 701 further includes a clocked sense (CS) amplifier circuit 1001. CS amplifier circuit 1001 is not shown in FIG. 8 to simplify the drawing. FIG. 10 also shows pass gate circuits 804-805.

Signals VTOPP and VTOPN are provided to the non-inverting (+) and inverting (−) inputs of pre-amplifier circuit 801A, respectively. Pre-amplifier circuit 801A amplifies the voltage difference between signals VTOPP and VTOPN to generate an output voltage signal that equals the difference between the voltages of signals PAMP and NAMP. Signals PAMP and NAMP are generated at the + and − outputs of pre-amplifier circuit 801A and are provided to the non-inverting (+) and inverting (−) inputs of pre-amplifier circuit 801B, respectively. Pre-amplifier circuit 801B amplifies the voltage difference between signals PAMP and NAMP to generate an output voltage signal that equals the difference between the voltages of signals VOUTP and VOUTN.

Signals VOUTP and VOUTN are generated at the + and − outputs of pre-amplifier circuit 801B and are provided to the non-inverting (+) and inverting (−) inputs of CS amplifier circuit 1001 and to pass gate circuits 804 and 805, respectively. The clock signal CLK is provided to a clock input of CS amplifier circuit 1001. CLK in FIGS. 7 and 10 refers to the same clock signal. Clock signal CLK enables and disables CS amplifier circuit 1001. CS amplifier circuit 1001 amplifies the voltage difference between signals VOUTP and VOUTN to generate output digital voltage signals COUTP and COUTN in response to a logic high state in clock signal CLK. Signal COUTN is the logical inverse of signal COUTP. Signals COUTP and COUTN are generated at the + and − outputs of CS amplifier circuit 1001, respectively, after each rising edge in clock signal CLK. CS amplifier circuit 1001 disables its output signals COUTP and COUTN in response to a logic low state in clock signal CLK.

The period of clock signal CLK is selected to provide enough time for the voltages of signals VTOPP and VTOPN to settle during each bit charge redistribution cycle and to allow for the delays of amplifier circuits 801A-801B and 1001. Clock signal CLK determines when output signals COUTP and COUTN are valid. After each rising edge of clock signal CLK, each of signals COUTP and COUTN indicates the result of a comparison between voltages VTOPP and VTOPN. Signal COUTP is provided to SAR logic circuit 702. In response to each rising edge of clock signal CLK during each iteration of the binary search algorithm, SAR logic circuit 702 determines whether to adjust the logic state of one of signals SW[N−1:0] based on signal COUTP. In the embodiment of FIG. 7, signal COUTN is not provided to SAR logic circuit 702 to simplify the circuitry in SAR logic circuit 702. In an alternative embodiment, both of signals COUTP and COUTN are provided to SAR logic circuit 702, and SAR logic circuit 702 is responsive to both of signals COUTP and COUTN.

Referring again to FIG. 8, each of capacitors 814 is coupled to one of the switch circuits 811. For example, capacitors 814A-814H are coupled to switch circuits 811A-811H, respectively. Switch circuits 811A-811G, 817, and 830 couple capacitors 814A-814G, 816, and 823, respectively, to the node at voltage VREFN during the entire operation of ADC circuit 700. Switch circuit 811H couples capacitor 814H to a node at voltage VREFP through its first terminal or to the same node at voltage VREFP through its second terminal in response to signal SW[11]. Switch circuits 811 and 817 are added to circuit 701 to match the electrical effects of switch circuits 831 and 830, respectively.

ADC circuit 700 first functions in a sampling mode to sample signal VIN and then performs a binary search algorithm. ADC circuit 700 determines a logic state of one of the signals SW[N−1:0] in each iteration of the binary search algorithm. In one embodiment, the voltage of VCM is provided to the inputs of comparator circuit 801 through pass gate circuits 802 and 803 during the sampling mode. In an alternative embodiment, the outputs of comparator circuit 801 are coupled to the inputs of comparator circuit 801 through pass gate circuits 804-805 during the sampling mode. Thus, either pass gate circuits 802-803 or pass gate circuits 804-805 are conductive during the sampling mode. Pass gates 802-803 or pass gates 804-805 are conductive to cause the voltages VTOPP and VTOPN at the inputs of comparator circuit 801 to equal voltage VCM. Pass gate circuits 802-803 are controlled by signal SA, and pass gate circuits 804-805 are controlled by signal SB. All of pass gate circuits 802-805 are non-conductive after the sampling mode during the binary search algorithm.

Circuit 701 has a track and hold circuit that includes switch circuit 831H and capacitor 824H. During the sampling mode, switch circuit 831H and capacitor 824H sample the voltage of signal VIN. Switch circuit 831H couples capacitor 824H to a node at signal VIN in response to a switch control signal 51, as shown, e.g., in FIG. 8, to sample the voltage of signal VIN. After the voltage of signal VIN is sampled, the voltage across capacitor 824H equals VCM−VIN.

Circuit 701 receives 12 signals SW[11:0] from register circuit 703 in the exemplary embodiment of FIG. 8. Signals SW[11:0] control the switching of switch circuits 831. For example, signals SW[0], SW[1], SW[2], SW[4], SW[5], SW[6], and SW[10] control the switching of switch circuits 831A-831G, respectively. The switching of switch circuit 831H is controlled by both of signals SW[11] and 51.

During the sampling mode, all of signals SW[11:0] are in logic low states. In response to all of signals SW[11:0] being in logic low states, each of the switch circuits 831, except switch circuit 831H, couples its respective capacitor 824 to the node at voltage VREFN. For example, switch circuits 831A-831G couple capacitors 824A-824G, respectively, to the node at voltage VREFN, as shown, e.g., in FIG. 8.

In response to all of signals SW[11:0] being in logic low states, logic control circuit 920 generates logic low states in all of the switch control signals VSC[5:0]. In response to all of signals VSC[5:0] being in logic low states, switch circuits 901A-901F couple capacitors 911A-911F, respectively, to node 908, and switch circuits 902A-902F couple capacitors 911A-911F, respectively, to the node at the ground voltage, as shown, e.g., in FIG. 9. When all of capacitors 911A-911F are coupled between node 908 and the node at the ground voltage, capacitors 911A-911F are pre-charged to the pre-charge reference voltage VPCR, which equals voltage REF.

Each iteration of the binary search algorithm starts with a bit charge redistribution cycle. At the start of the bit charge redistribution cycle for the first iteration of the binary search algorithm, a rising edge occurs in the most significant bit (MSB) of signals SW[11:0] (i.e., signal SW[11]), and the remaining 11 signals SW[10:0] remain in logic low states.

Switch circuit 831H switches to couple capacitor 824H to node 907 at voltage VREFP in response to the rising edge in signal SW[11]. The voltage of signal VTOPP adjusts based on voltage VREFP being applied to capacitor 824H.

The remaining switch circuits 831, including switch circuits 831A-831G, continue to couple the remaining capacitors 824, including capacitors 824A-824G, respectively, to the node at voltage VREFN in response to signals SW[10:0] being in logic low states. Switch circuit 811H switches to couple capacitor 814H from its first terminal to its second terminal in response to signal SW[11] changing to a logic high state. Switch circuit 811H is switched so that the voltage of signal VTOPN matches the transient response in the voltage of signal VTOPP that is caused by switching switch circuit 831H.

Figure 11:
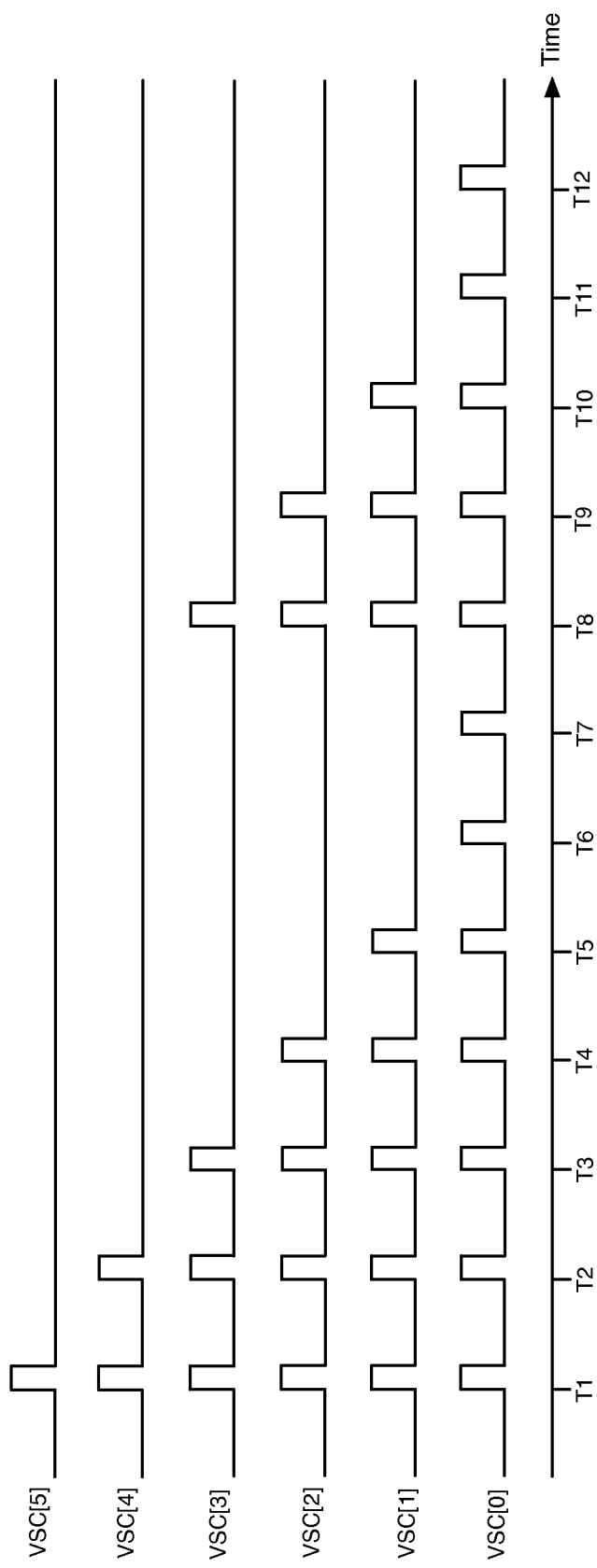
FIG. 11 is a diagram that illustrates examples of voltage waveforms for the switch control signals shown in FIG. 9, according to an embodiment of the present invention.

In response to a rising edge in signal SW[11], logic control circuit 920 generates a logic high pulse in each of the signals VSC[5:0]. FIG. 11 is a diagram that illustrates examples of voltage waveforms for the switch control signals VSC[5:0], according to an embodiment of the present invention. As shown in FIG. 11, logic control circuit 920 generates a logic high pulse in each of the 6 signals VSC[5:0] at time T1 in response to a rising edge in signal SW[11].

In response to the logic high pulses in signals VSC[5:0], switch circuits 901A-901F switch to couple capacitors 911A-911F, respectively, to node 907 at voltage VREFP, and switch circuits 902A-902F switch to couple capacitors 911A-911F, respectively, to node 908 at voltage VPCR. Coupling capacitors 911A-911F between nodes 907 and 908 during the bit charge redistribution cycle reduces the time for voltage VREFP to settle back to its ideal voltage REF. As a result, the voltage of VTOPP settles to its target voltage faster, and ADC circuit 700 may operate at a faster analog-to-digital conversion rate. Voltage stabilization circuit 707 may increase and/or decrease reference voltage VREFP to cause reference voltage VREFP to settle to its ideal voltage REF in less time. Voltage stabilization circuit 707 reduces variations in reference voltage VREFP. Voltage stabilization circuit 707 reduces changes in voltage VREFP at node 907 that are caused by switching switch circuit 831H. In response to the falling edges in signals VSC[5:0] at the end of the logic high pulses, switch circuits 901A-901F switch to couple capacitors 911A-911F, respectively, to node 908 again, and switch circuits 902A-902F switch to couple capacitors 911A-911F, respectively, to the node at the ground voltage again.

At or near the end of the bit charge redistribution cycle, amplifier circuits 801A-801B and 1001 compare the voltages of signals VTOPP and VTOPN to generate signals COUTP and COUTN. If the voltage of signal VTOPP is greater than the voltage of signal VTOPN, amplifier circuits 801A-801B and 1001 cause the voltage of signal COUTP to be in a logic high state in response to the next rising edge in clock signal CLK. If the voltage of signal COUTP is in a logic high state in the first iteration of the binary search algorithm at the next rising edge in signal CLK, SAR logic circuit 702 causes MSB signal SW[11] to remain in the logic high state.

If the voltage of signal VTOPP is less than the voltage of signal VTOPN, amplifier circuits 801A-801B and 1001 cause the voltage of signal COUTP to be in a logic low state in response to the next rising edge in clock signal CLK. If the voltage of signal COUTP is in a logic low state in the first iteration of the binary search algorithm at the next rising edge in clock signal CLK, SAR logic circuit 702 clears the MSB signal SW[11] to a logic low state. Switch circuit 831H switches to couple capacitor 824H to the node at voltage VREFN in response to MSB signal SW[11] changing to a logic low state. Signal 51 does not affect the switching of switch circuit 831H during the binary search algorithm, until the next sampling mode.

At the start of the bit charge redistribution cycle for the second iteration of the binary search algorithm, the MSB signal SW[11] remains in the logic state determined in the first iteration, a rising edge occurs in the second MSB signal SW[10], and the remaining 10 signals SW[9:0] remain in logic low states. Switch circuit 831G switches to couple capacitor 824G to node 907 at voltage VREFP in response to the rising edge in signal SW[10]. The voltage of signal VTOPP adjusts based on voltage VREFP being applied to capacitor 824G. The remaining switch circuits 831, including switch circuits 831A-831F, continue to couple the remaining capacitors 824, including capacitors 824A-824F, respectively, to the node at voltage VREFN in response to signals SW[9:0] being in logic low states.

In response to the rising edge in signal SW[10], logic control circuit 920 generates a logic high pulse in each of the 5 signals VSC[4:0], as shown in FIG. 11 at time T2. In response to the logic high pulses in signals VSC[4:0], switch circuits 901A-901E switch to couple capacitors 911A-911E, respectively, to node 907, and switch circuits 902A-902E switch to couple capacitors 911A-911E, respectively, to node 908. Coupling capacitors 911A-911E between nodes 907 and 908 during the bit charge redistribution cycle reduces the time for voltage VREFP to settle back to its ideal voltage REF. Voltage stabilization circuit 707 reduces variations in reference voltage VREFP at node 907 that are caused by switching switch circuit 831G to couple capacitor 824G to node 907. In response to the falling edges in signals VSC[4:0] at the end of the logic high pulses, switch circuits 901A-901E switch to couple capacitors 911A-911E, respectively, to node 908, and switch circuits 902A-902E switch to couple capacitors 911A-911E, respectively, to the node at the ground voltage.

At or near the end of the bit charge redistribution cycle, amplifier circuits 801A-801B and 1001 compare the voltages of signals VTOPP and VTOPN to generate updated voltages in signals COUTP and COUTN in response to clock signal CLK. SAR logic circuit 702 then determines whether to maintain signal SW[10] in a logic high state or whether to clear signal SW[10] to a logic low state based on the updated voltage of signal COUTP in response to clock signal CLK.

During a bit charge redistribution cycle of each subsequent iteration of the binary search algorithm performed by circuit 700, the next capacitor 824 from right to left in FIG. 8 is coupled to node 907 at voltage VREFP by switching a respective one of switch circuits 831 to determine the logic state of a signal in the digital output DOUT. The capacitors 824 having capacitances of $2^4 C$, $2^3 C$, $2^2 C$, $2^1 C$, and C in the MSB sub-array are coupled to node 907 at voltage VREFP by switching respective ones of switch circuits 831 during the bit charge redistribution cycles for the third, fourth, fifth, sixth, and seventh iterations of the binary search algorithm in response to signals SW[9], SW[8], SW[7], SW[6], and SW[5], respectively.

The capacitors 824 having capacitances of $2^4 C$, $2^3 C$, $2^2 C$, $2^1 C$, and C in the LSB sub-array are coupled to node 907 at voltage VREFP by switching respective ones of switch circuits 831 during the bit charge redistribution cycles for the eighth, ninth, tenth, eleventh, and twelfth iterations of the binary search algorithm in response to signals SW[4], SW[3], SW[2], SW[1], and SW[0], respectively. SAR logic circuit 702 determines the logic state of one of signals SW[11:0] based on the output signal COUTP of circuit 701 in response to clock signal CLK after the bit charge redistribution cycle for a respective iteration of the binary search algorithm. After SAR logic circuit 702 has determined a logic state for one of signals SW[11:0] during a respective iteration of the binary search algorithm, the logic state of that one of signals SW[11:0] remains the same during subsequent iterations of the binary search algorithm and is provided in the output signals DOUT at the end of the binary search algorithm.

The differential voltage VDIFF between the inputs of comparator circuit 801 settles to the target voltage shown in equations (2)-(3) during the bit charge redistribution cycles. Equations (2)-(3) quantify the effects that the switching of each of switch circuits 831 between VREFN and VREFP has on differential voltage VDIFF. In equations (2)-(3) below, VDIFF=VTOPP−VTOPN, $B_i$ equals the logic state (i.e., 1 or 0) of one of the signals SW[N−1:0] during a respective iteration of the binary search algorithm, and N is the number of signals SW[N−1:0]. N also equals the number of signals DOUT. The variable K in equations (2)-(3) is shown in equation (4). In equation (4), $C_A$ is the capacitance of each of capacitors 815 and 825, $C_D$ is the capacitance of each of capacitors 812-813 and 821-822, L is the number of capacitors 824 in the LSB sub-array (i.e., 5), and M is the number of capacitors 824 in the MSB sub-array (i.e., 7).

$$VDIFF = K\left[-VIN + \frac{VREFP}{2^N}\left(\sum_{i=0}^{N-1} B_i 2^{i+1}\right) + \frac{VREFN}{2^N}\left(2^N - \sum_{i=0}^{N-1} B_i 2^{i+1}\right)\right] \quad (2)$$

$$VDIFF = K\left[-VIN + VREFN + \frac{1}{2^N}(VREFP - VREFN) \times \left(\sum_{i=0}^{N-1} B_i 2^{i+1}\right)\right] \quad (3)$$

$$K = \frac{(C_A + 2C_D + 2^{L+1}) \times 2^M}{(C_A + 2C_D + 2^{L+1})(2^{M+1} - 1 + C_A) - C_A^2} \quad (4)$$

During the bit charge redistribution cycle in each of the iterations of the binary search algorithm performed by circuit 700, logic control circuit 920 generates a logic high pulse in one or more of signals VSC[5:0]. In response to the logic high pulse in one or more of signals VSC[5:0], respective ones of switch circuits 901 and 902 switch to couple respective ones of capacitors 911 between nodes 907 and 908. Coupling one or more of capacitors 911A-911F between nodes 907 and 908 during the bit charge redistribution cycle reduces the time for the voltage of VREFP to settle back to its ideal voltage REF and reduces voltage variations in reference voltage VREFP.

FIG. 11 illustrates the waveforms for signals VSC[5:0] that logic control circuit 920 generates during an exemplary twelve iterations of the binary search algorithm performed by circuit 700, according to an embodiment of the present invention. Times T1-T12 shown in FIG. 11 correspond approximately to the start of the bit charge redistribution cycles for the first through the twelfth iterations, respectively, of the binary search algorithm. Logic control circuit 920 generates the logic high pulses in signals VSC[5:0] that are shown in FIG. 11 at the 12 points in time T1-T12 in response to rising edges in the 12 signals SW[11]-SW[0], respectively.

In each subsequent iteration of the binary search algorithm from time T1 to time T6, a progressively smaller capacitor 824 in the MSB sub-array is coupled to node 907, and a logic high pulse is generated in one less of the signals VSC[5:0]. At each of times T6 and T7, a logic high pulse is only generated in signal VSC[0] to couple capacitor 911A between nodes 907 and 908 to stabilize the voltage of VREFP, while the remaining signals VSC[5:1] remain in logic low states. Times T6 and T7 are the beginnings of the bit charge redistribution cycles for the sixth and seventh iterations of the binary search algorithm during which capacitors 824F and 824E are coupled to node 907 through switch circuits 831F and 831E in response to signals SW[6] and SW[5], respectively.

At time T8, logic high pulses are generated in the 4 signals VSC[3:0] to couple capacitors 911A-911D between nodes 907 and 908, while the remaining 2 signals VSC[5:4] remain in logic low states. Time T8 indicates the start of the bit charge redistribution cycle for the eighth iteration of the binary search algorithm during which capacitor 824D is coupled to node 907 in response to signal SW[4]. Capacitor 824D has a capacitance of $2^4 C$, which is larger than the smallest 4 capacitors in the MSB sub-array. Therefore, four capacitors 911A-911D are coupled between nodes 907 and 908 to stabilize the voltage of VREFP during the bit charge redistribution cycle for the eighth iteration. Four capacitors 911A-911D are also coupled between nodes 907 and 908 to stabilize the voltage of VREFP during the bit charge redistribution cycle for the third iteration at time T3 when one of the capacitors 824 in the MSB sub-array having a capacitance of $2^4 C$ is coupled to node 907.

In each subsequent iteration of the binary search algorithm from time T8 to time T11, a progressively smaller capacitor 824 in the LSB sub-array is coupled to node 907, and a logic high pulse is generated in one less of the signals VSC[5:0]. At each of times T11 and T12, a logic high pulse is only generated in signal VSC[0] to couple capacitor 911A between nodes 907 and 908, while the remaining signals VSC[5:1] remain in logic low states. Times T11 and T12 are the beginnings of the bit charge redistribution cycles for the eleventh and twelfth iterations of the binary search algorithm during which capacitors 824B and 824A are coupled to node 907 through switch circuits 831B and 831A in response to signals SW[1] and SW[0], respectively.

Figure 12:
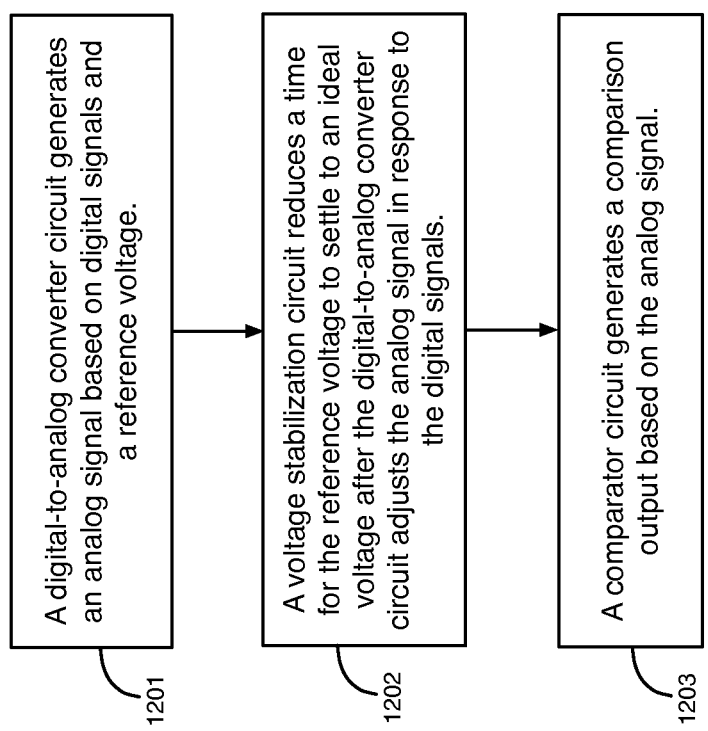
FIG. 12 is a flow chart that illustrates examples of operations that can be performed by an ADC circuit, according to an embodiment of the present invention.

FIG. 12 is a flow chart that illustrates examples of operations that can be performed by an ADC circuit, according to an embodiment of the present invention. In operation 1201, a digital-to-analog converter circuit generates an analog signal based on digital signals and a reference voltage. In operation 1202, a voltage stabilization circuit reduces a time for the reference voltage to settle to an ideal voltage after the digital-to-analog converter circuit adjusts the analog signal in response to the digital signals. In operation 1203, a comparator circuit generates a comparison output based on the analog signal. The digital signals are generated based on the comparison output. ADC circuits 100 and 700 are examples of ADC circuits that can perform the operations of FIG. 12.

Figure 13:
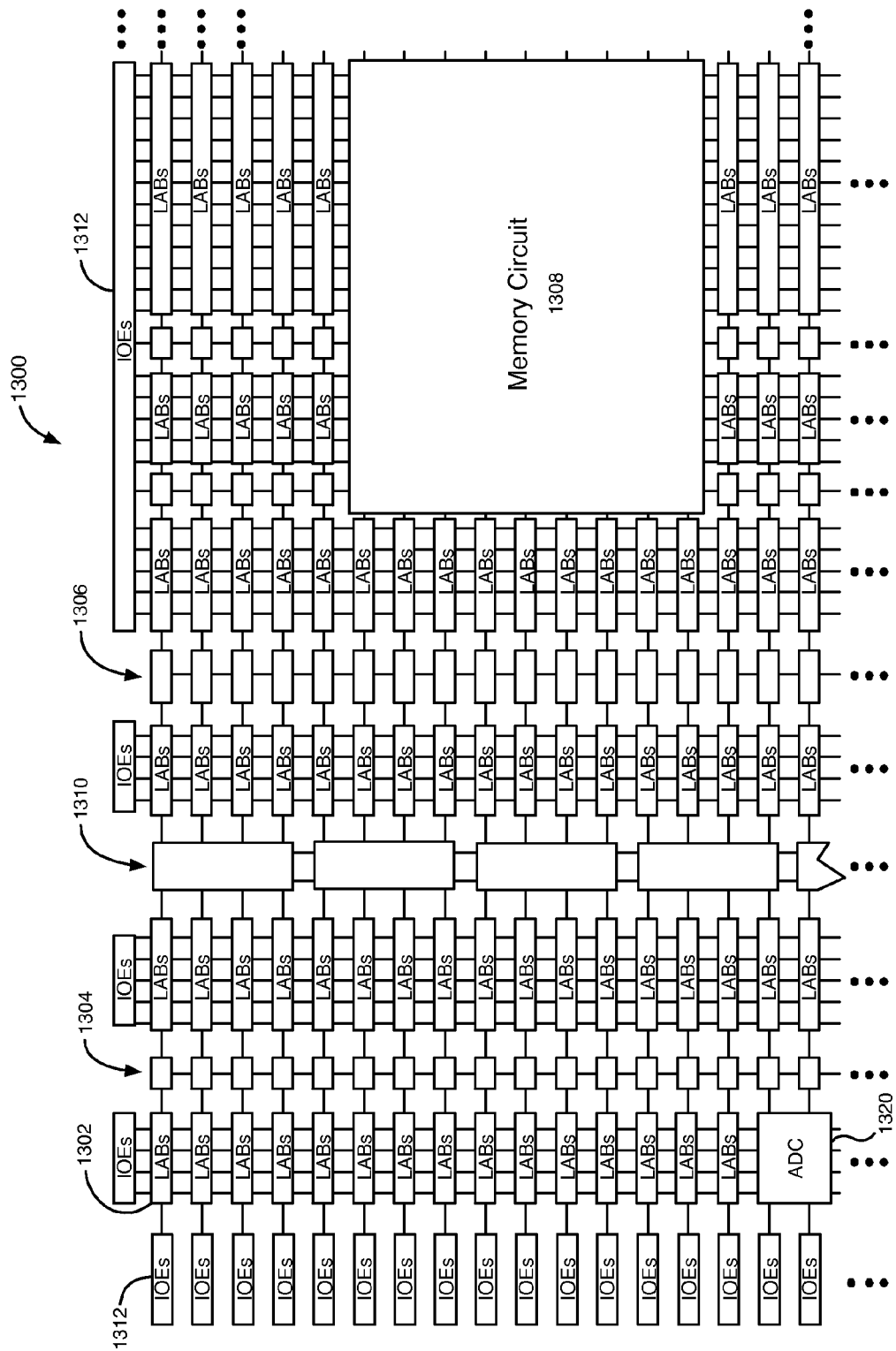
FIG. 13 is a simplified partial block diagram of a field programmable gate array (FPGA) that can include aspects of the present invention.

FIG. 13 is a simplified partial block diagram of a field programmable gate array (FPGA) 1300 that can include aspects of the present invention. FPGA 1300 is merely one example of an integrated circuit that can include features of the present invention.

Embodiments of the present invention can be used in numerous types of integrated circuits, such as field programmable gate arrays (FPGAs), programmable logic devices (PLDs), complex programmable logic devices (CPLDs), programmable logic arrays (PLAs), application specific integrated circuits (ASICs), general purpose processors, central processing units (CPUs), digital signal processors, controller integrated circuits, memory integrated circuits, analog integrated circuits, and digital integrated circuits.

FPGA 1300 includes a two-dimensional array of programmable logic array blocks (or LABs) 1302 that are interconnected by a network of column and row interconnect conductors of varying length and speed. LABs 1302 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure of interconnect conductors. The programmable interconnect structure can be programmed to interconnect the logic elements in almost any desired configuration.

FPGA 1300 may also include a distributed memory structure including random access memory (RAM) circuits of varying sizes provided throughout the array. The RAM circuits include, for example, circuits 1304, circuits 1306, and circuit 1308. These memory circuits can also include shift registers and first-in first-out (FIFO) circuits.

FPGA 1300 may further include digital signal processing (DSP) circuits 1310 that can implement, for example, multipliers with add or subtract features. Input/output elements (IOEs) 1312 located, in this example, around the periphery of the chip, support numerous single-ended and differential input/output standards. IOEs 1312 are coupled to pads. Each of the pads is an external terminal of the FPGA. FPGA 1300 may further include one or more ADC circuits 1320, as shown in FIG. 13. ADC circuits 100 and 700 are examples of ADC circuit 1320. ADC circuit 1320 may, for example, be used in FPGA 1300 for on-die power monitoring for power management, for motor control, or in a touch based sensor application. It is to be understood that FPGA 1300 is described herein for illustrative purposes only and that the present invention can be implemented in many different types of integrated circuits.

Figure 14:
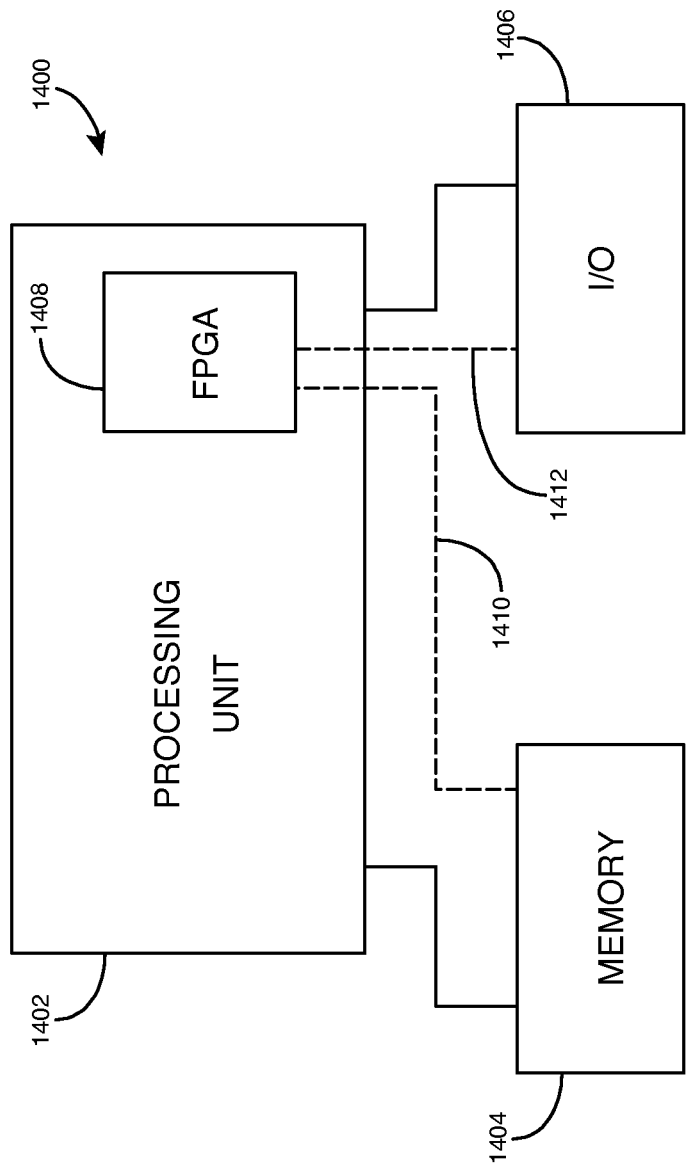
FIG. 14 shows a block diagram of an exemplary digital system that can embody techniques of the present invention.

The present invention can also be implemented in a system that has an FPGA as one of several components. FIG. 14 shows a block diagram of an exemplary digital system 1400 that can embody techniques of the present invention. System 1400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1400 can be provided on a single board, on multiple boards, or within multiple enclosures.

System 1400 includes a processing unit 1402, a memory unit 1404, and an input/output (I/O) unit 1406 interconnected together by one or more buses. According to this exemplary embodiment, an FPGA 1408 is embedded in processing unit 1402. FPGA 1408 can serve many different purposes within the system of FIG. 14. FPGA 1408 can, for example, be a logical building block of processing unit 1402, supporting its internal and external operations. FPGA 1408 is programmed to implement the logical functions necessary to carry on its particular role in system operation. FPGA 1408 can be specially coupled to memory 1404 through connection 1410 and to I/O unit 1406 through connection 1412.

Processing unit 1402 can direct data to an appropriate system component for processing or storage, execute a program stored in memory 1404, receive and transmit data via I/O unit 1406, or other similar functions. Processing unit 1402 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1408 can control the logical operations of the system. As another example, FPGA 1408 acts as a reconfigurable processor that can be reprogrammed as needed to handle a particular computing task. Alternatively, FPGA 1408 can itself include an embedded microprocessor. Memory unit 1404 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An analog-to-digital converter circuit comprising:
   a digital-to-analog converter circuit to generate a first analog signal based on digital signals and a reference voltage;
   a voltage stabilization circuit to reduce variations in the reference voltage in response to at least one of the digital signals; and
   a comparator circuit to generate a comparison output based on the first analog signal, wherein the digital signals are generated based on the comparison output.

2. The analog-to-digital converter circuit of claim 1 further comprising:
   a track and hold circuit to generate a sampled signal based on a second analog signal, wherein the comparator circuit generates the comparison output based in part on the second analog signal; and
   a successive approximation register circuit to generate the digital signals based on the comparison output using a binary search algorithm, wherein the successive approximation register circuit generates digital values that represent the second analog signal using the digital signals.

3. The analog-to-digital converter circuit of claim 1, wherein the voltage stabilization circuit comprises a first capacitor and a first switch circuit coupled to the first capacitor.

4. The analog-to-digital converter circuit of claim 3, wherein the voltage stabilization circuit further comprises a second switch circuit coupled to the first capacitor.

5. The analog-to-digital converter circuit of claim 4, wherein the first and the second switch circuits couple the first capacitor between a node at the reference voltage and a node at a pre-charge reference voltage in response to the digital signals to reduce variations in the reference voltage.

6. The analog-to-digital converter circuit of claim 5 further comprising:
   a unity gain buffer circuit to generate the reference voltage and the pre-charge reference voltage.

7. The analog-to-digital converter circuit of claim 5, wherein the voltage stabilization circuit further comprises a second capacitor and third and fourth switch circuits that are each coupled to the second capacitor.

8. The analog-to-digital converter circuit of claim 7, wherein the third and the fourth switch circuits couple the second capacitor between the node at the reference voltage and the node at the pre-charge reference voltage in response to the digital signals to reduce variations in the reference voltage.

9. The analog-to-digital converter circuit of claim 1, wherein the digital-to-analog converter circuit comprises an array of capacitors and switch circuits, wherein each of the switch circuits is coupled to a respective one of the capacitors in the array, and wherein each of the switch circuits switches to couple the respective one of the capacitors in the array to a node at the reference voltage in response to one of the digital signals.

10. An analog-to-digital converter circuit comprising:
    first capacitors;
    first switch circuits coupled to the first capacitors, wherein the first switch circuits are controlled by digital signals;
    a voltage stabilization circuit to reduce a time for a reference voltage to settle to an ideal voltage after one of the first switch circuits is switched to couple one of the first capacitors to a node at the reference voltage; and
    a comparator circuit coupled to the first capacitors, wherein the comparator circuit generates a comparison output, and wherein the digital signals are generated based on the comparison output.

11. The analog-to-digital converter circuit of claim 10 further comprising:
    a track and hold circuit to generate a sampled signal based on an analog signal, wherein the comparator circuit generates the comparison output based in part on the sampled signal; and
    a successive approximation register circuit to generate the digital signals based on the comparison output using a binary search algorithm, wherein the successive approximation register circuit generates a digital output that represents the analog signal using the digital signals.

12. The analog-to-digital converter circuit of claim 10, wherein the voltage stabilization circuit comprises a second capacitor and a second switch circuit coupled to the second capacitor.

13. The analog-to-digital converter circuit of claim 12, wherein the voltage stabilization circuit further comprises a third switch circuit coupled to the second capacitor, and wherein the second and the third switch circuits couple the second capacitor between the node at the reference voltage and a node at a pre-charge reference voltage in response to the digital signals to reduce the time for the reference voltage to settle to the ideal voltage.

14. The analog-to-digital converter circuit of claim 13, wherein the second switch circuit couples the second capacitor to the node at the pre-charge reference voltage and the third switch circuit couples the second capacitor to a third node to generate the pre-charge reference voltage across the second capacitor before the one of the first switch circuits is switched to couple the one of the first capacitors to the node at the reference voltage.

15. The analog-to-digital converter circuit of claim 12, wherein the voltage stabilization circuit further comprises a third capacitor and a third switch circuit that is coupled to the third capacitor.

16. The analog-to-digital converter circuit of claim 15, wherein the voltage stabilization circuit further comprises a fourth switch circuit coupled to the third capacitor, and wherein the third and the fourth switch circuits couple the third capacitor between the node at the reference voltage and a node at a pre-charge reference voltage in response to the digital signals to reduce the time for the reference voltage to settle to the ideal voltage.

17. A method comprising:
    generating a first analog signal based on digital signals and a reference voltage using a digital-to-analog converter circuit;
    reducing a time for the reference voltage to settle to an ideal voltage using a voltage stabilization circuit after the digital-to-analog converter circuit adjusts the first analog signal in response to the digital signals; and
    generating a comparison output based on the first analog signal using a comparator circuit, wherein the digital signals are generated based on the comparison output.

18. The method of claim 17 further comprising:
    generating a sampled signal based on a second analog signal using a track and hold circuit, wherein generating a comparison output based on the first analog signal using a comparator circuit comprises generating the comparison output based in part on the second analog signal;
    generating the digital signals based on the comparison output using a successive approximation register circuit that implements a binary search algorithm; and
    generating digital values that represent the second analog signal based on the digital signals using the successive approximation register circuit.

19. The method of claim 17, wherein reducing a time for the reference voltage to settle to an ideal voltage using a voltage stabilization circuit after the digital-to-analog converter circuit adjusts the first analog signal in response to the digital signals comprises coupling a first capacitor between a node at the reference voltage and a node at a pre-charge reference voltage in response to the digital signals.

20. The method of claim 19, wherein reducing a time for the reference voltage to settle to an ideal voltage using a voltage stabilization circuit after the digital-to-analog converter circuit adjusts the first analog signal in response to the digital signals further comprises generating the pre-charge reference voltage across the first capacitor before the digital-to-analog converter circuit adjusts the first analog signal in response to the digital signals.

21. The method of claim 19, wherein reducing a time for the reference voltage to settle to an ideal voltage using a voltage stabilization circuit after the digital-to-analog converter circuit adjusts the first analog signal in response to the digital signals further comprises coupling a second capacitor to the node at the reference voltage using a first switch circuit and coupling the second capacitor to the node at the pre-charge reference voltage using a second switch circuit in response to the digital signals.

\* \* \* \* \*